United States Patent [19]
Agrawal et al.

[11] Patent Number: 5,644,496
[45] Date of Patent: Jul. 1, 1997

[54] PROGRAMMABLE LOGIC DEVICE WITH INTERNAL TIME-CONSTANT MULTIPLEXING OF SIGNALS FROM EXTERNAL INTERCONNECT BUSES

[75] Inventors: Om P. Agrawal, Los Altos, Calif.;
Michael J. Wright, Boulder, Colo.

[73] Assignee: Advanced Micro Devices, Inc.,
Sunnyvale, Calif.

[21] Appl. No.: 80,658

[22] Filed: Jun. 18, 1993

Related U.S. Application Data

[63] Continuation-in-part of Ser. No. 429,125, Oct. 30, 1989, Pat. No. 5,233,539, Ser. No. 442,528, Nov. 27, 1989, Pat. No. 5,260,881, Ser. No. 538,211, Jun. 14, 1990, Pat. No. 5,255,203, Ser. No. 514,297, Apr. 25, 1990, Pat. No. 5,231,588, Ser. No. 924,267, Aug. 3, 1992, abandoned, Ser. No. 924,685, Aug. 3, 1992, Pat. No. 5,457,409, Ser. No. 924,201, Aug. 3, 1992, Pat. No. 5,489,857, Ser. No. 12,573, Feb. 1, 1993, Pat. No. 5,359,536, said Ser. No. 429,125, is a division of Ser. No. 394,221, Aug. 15, 1989, Pat. No. 5,212,652.

[51] Int. Cl.⁶ .................... H03K 17/693; H03K 19/177
[52] U.S. Cl. .................... 364/489; 326/39; 326/41
[58] Field of Search ..................... 364/488, 489, 364/490, 716, 578; 395/500; 326/39, 41; 340/825.83

[56] References Cited

U.S. PATENT DOCUMENTS

| | | | |
|---|---|---|---|
| 4,536,859 | 8/1985 | Kamuro | 365/154 |
| 4,609,986 | 9/1986 | Hartmann et al. | 364/200 |
| 4,642,487 | 2/1987 | Carter | 307/465 |
| 4,668,880 | 5/1987 | Shoji | 364/488 |
| 4,675,673 | 6/1987 | Oliver | 364/488 |
| 4,677,318 | 6/1987 | Veenstra | 307/465 |
| 4,688,072 | 8/1987 | Heath et al. | 364/491 |
| 4,706,216 | 11/1987 | Carter | 365/94 |
| 4,713,557 | 12/1987 | Carter | 307/242 |
| 4,724,531 | 2/1988 | Angleton et al. | 364/490 |
| 4,758,985 | 7/1988 | Carter | 365/94 |

(List continued on next page.)

FOREIGN PATENT DOCUMENTS

| | | |
|---|---|---|
| A-0177261 | 9/1986 | European Pat. Off. . |
| A-0358501 | 3/1990 | European Pat. Off. . |
| A-0398552 | 11/1990 | European Pat. Off. . |
| A-0415542 | 6/1991 | European Pat. Off. . |
| PCT/US85/ 01111 | 6/1985 | WIPO . |

OTHER PUBLICATIONS

R.H. Freeman, "XC3000 Family of User-Programmable Gate Arrays", Microprocessors & Microsystems, vol. 13, No. 5, Jun. 1989, pp. 313-320.

"XC3000 Logic Cell Array Family", (technical data handbook), Published by Xilinx, pp. 1-31.

"The Programmable Gate Array Design Handbook", 1st Ed., Published by Xilinx, pp. 1-1 to 1-31.

Sami et al., "Reconfigurable Architectures for VLSI Processing Arrays", Proceedings of the IEEE, vol. 74, No. 5, May 1986, pp. 712-722.

*Primary Examiner*—Vincent N. Trans
*Attorney, Agent, or Firm*—Fliesler, Dubb, Meyer & Lovejoy

[57] ABSTRACT

A method and on-chip architecture are disclosed for multiplexing signals from selected external interconnect buses to chip internal buses such that bus rerouting can be implemented programmably without substantially affecting timing relations between time-parallel signals of a rerouted bus. An on-chip switch matrix is provided having N input lines crossing with M output lines to provide N times M crosspoints. A plurality of substantially less than N times M programmable interconnect switches (PIP's) are distributed symmetrically among the N·M crosspoints such that a same first number of interconnect switches (PIP's) are found along each of the N input lines thereby providing equal loading on each input line. The plurality of programmable interconnect switches (PIP's) are further distributed among the N·M crosspoints such that a same second number of interconnect switches (PIP's) are found along each of the M output lines thereby providing equal loading on each output line.

49 Claims, 11 Drawing Sheets

U.S. PATENT DOCUMENTS

| | | | |
|---|---|---|---|
| 4,775,942 | 10/1988 | Ferreri et al. | 364/491 |
| 4,786,904 | 11/1988 | Graham, III et al. | 364/488 |
| 4,845,633 | 7/1989 | Furtek | 364/490 |
| 4,870,302 | 9/1989 | Freeman | 307/465 |
| 4,931,946 | 6/1990 | Ravindra et al. | 364/490 |
| 5,036,473 | 7/1991 | Butts et al. | 364/490 |
| 5,089,973 | 2/1992 | Furtek | 364/489 |
| 5,126,950 | 6/1992 | Rees et al. | 364/490 |
| 5,128,871 | 7/1992 | Schmitz | 364/490 |
| 5,224,056 | 6/1993 | Chene et al. | 364/490 |
| 5,260,610 | 11/1993 | Pedersen et al. | 307/465 |
| 5,260,611 | 11/1993 | Cliff et al. | 307/465 |
| 5,295,082 | 3/1994 | Chang et al. | 364/490 |
| 5,309,372 | 5/1994 | Marui et al. | 364/491 |
| 5,317,698 | 5/1994 | Chan | 364/491 |
| 5,349,248 | 9/1994 | Parlour | 364/489 |

OTHER PUBLICATIONS

F.B. Manning, "An Approach to Highly Integrated, Computer–Maintained Cellular Arrays", IEEE Transactions on Computers, vol. C–26, No. 6, Jun. 1977, pp. 536–552.

S.K. Knapp, "Optimizing Programmable Gate Array Designs", Ire Wescon Convention Record, vol. 32, Nov. 1988, pp. 421–427.

XCELL, The Newsletter for Xilinx Programmable Gate Array Users, Second Third Quarter 1989, Issue 3.

XC4000 Logic Cell Array Family, Xilinx, Inc., 1990.

ACT Family Field Programmable Gate Array Databook, Actel Corporation, Apr. 1990.

Altera User–Configurable Logic Databook, Sep. 1988.

"The XC4000 Logic Cell Array Family—Data Book", published by XILINX, 1991, pp. 1–64.

"The XC4000 Logic Cell Array Family—Technical Data", published by XILINX, 1990, pp. 1–53.

Dave Bursky, "On–Chip RAM and Hierarchical Routing Improve Programmable–Array Flexibility", Electronic Design, Jul. 12, 1990, pp. 35–36.

Peter Alfke, "Third–Generation Architecture Boosts Speed and Density of Field–Programmable Gate Arrays", XILINX, Jun. 1990, pp. 1–12.

"MACH™ 3 and 4 Family Data Book, 2nd Generation High Density EE CMOS Programmable Logic", Advanced Micro Devices, Jan. 1993, pp. 27–28.

"Chortle: A Technology Mapping Program for Lookup Table–Based Field Programmable Gate Arrays" by Francis et al, IEEE 27th ACM/IEEE Design Automation Conference, 1990, pp. 613–619.

"Reconfigurable Architectures for VLSI Processing Arrays" by M. Sami et al, Proceedings of the IEEE, vol. 74, No. 5, May 1986, pp. 712–722.

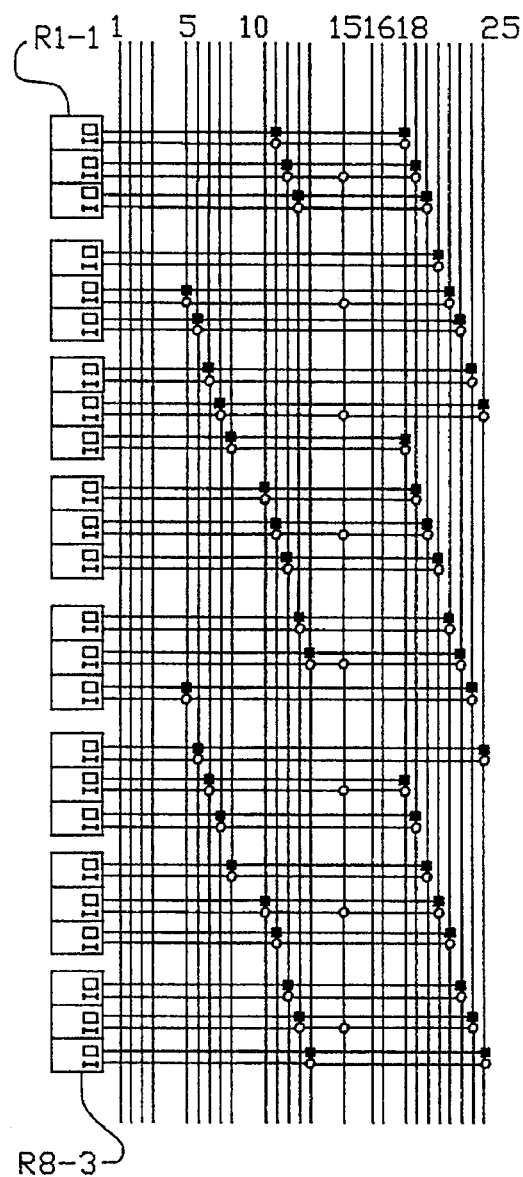
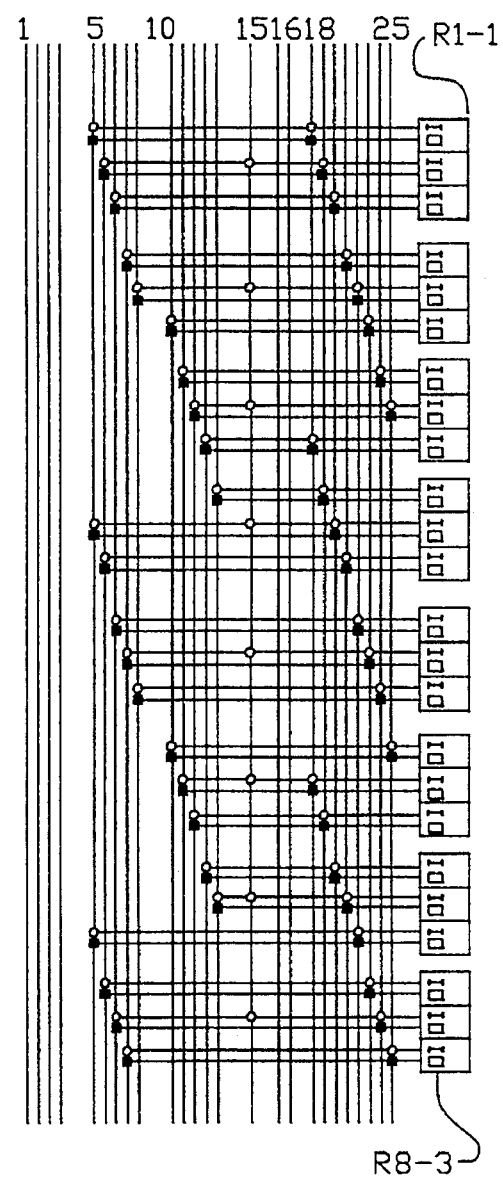
FIG.5A
FIG.5B

5,644,496

PROGRAMMABLE LOGIC DEVICE WITH INTERNAL TIME-CONSTANT MULTIPLEXING OF SIGNALS FROM EXTERNAL INTERCONNECT BUSES

CROSS REFERENCE TO RELATED APPLICATIONS

This application is a continuation-in-part (CIP) of the following U.S. patent applications which are assigned to the assignee of the present application, are related to the present application and whose disclosures are incorporated herein by reference:

(A) Ser. No. 07/429,125 filed Oct. 30, 1989 by Om P. Agrawal et al., and entitled PROGRAMMABLE GATE ARRAY WITH IMPROVED INPUT/OUTPUT STRUCTURE, now U.S. Pat. No. 5,233,539 (said application being a divisional of Ser. No. 07/394,221 filed Aug. 15, 1989 and issued May. 18, 1993 as U.S. Pat. No. 5,212,652);

(B) Ser. No. 07/442,528 filed Nov. 27, 1989 by Om P. Agrawal et al., and entitled PROGRAMMABLE GATE ARRAY WITH IMPROVED LOGIC BLOCK, now U.S. Pat. No. 5,260,881;

(C) Ser. No. 07/538,211 filed Jun. 14, 1990 by Om P. Agrawal et al., and entitled IMPROVED INTERCONNECT STRUCTURE FOR PROGRAMMABLE LOGIC DEVICE, now U.S. Pat. No. 5,255,203;

(D) Ser. No. 07/514,297 filed Apr. 25, 1990 by Om P. Agrawal et al., and entitled PROGRAMMABLE GATE ARRAY WITH LOGIC CELLS HAVING SYMMETRICAL INPUT/OUTPUT STRUCTURES, now U.S. Pat. No. 5,231,588;

(E) Ser. No. 07/924,267 filed Aug. 3, 1992 by Om P. Agrawal, and entitled A MULTIPLE ARRAY PROGRAMMABLE LOGIC DEVICE WITH A PLURALITY OF PROGRAMMABLE SWITCH MATRICES, now abandoned;

(F) Ser. No. 07/924,685 filed Aug. 3, 1992 by Om P. Agrawal et al., and entitled ARCHITECTURE OF A MULTIPLE ARRAY HIGH DENSITY PROGRAMMABLE LOGIC DEVICE WITH A PLURALITY OF PROGRAMMABLE SWITCH MATRICES, now U.S. Pat. No. 5,457,409;

(G) Ser. No. 07/924,201 filed Aug. 3, 1992 by Om P. Agrawal et al., and entitled FLEXIBLE SYNCHRONOUS/ASYNCHRONOUS CELL STRUCTURE FOR A HIGH DENSITY PROGRAMMABLE LOGIC DEVICE, now U.S. Pat. No. 5,489,857;

(H) Ser. No. 08/012,573 filed Feb. 1, 1993 by Om P. Agrawal et al., and entitled PROGRAMMABLE GATE ARRAY WITH IMPROVED INTERCONNECT STRUCTURE, now U.S. Pat. No. 5,329,460; and (I) Ser. No. 08/025,551 filed Mar. 3, 1993 by Om P. Agrawal et al., and entitled PROGRAMMABLE GATE ARRAY WITH IMPROVED INTERCONNECT STRUCTURE, INPUT/OUTPUT STRUCTURE AND CONFIGURABLE LOGIC BLOCK, now U.S. Pat. No. 5,359,536.

BACKGROUND

Field of the Invention

The invention relates generally to the field of programmable logic devices (PLD's) and field-programmable gate arrays (FPGA's). The invention relates more specifically to the problem of routing bus signals into and through user-programmable devices.

Cross Reference to Related Patents

The following U.S. patent(s) are assigned to the assignee of the present application, are related to the present application and their disclosures are incorporated herein by reference:

(A) U.S. Pat. No. 5,015,884 issued May 14, 1991 to Om P. Agrawal, et al, and entitled, MULTIPLE ARRAY HIGH PERFORMANCE PROGRAMMABLE LOGIC DEVICE FAMILY;

(B) U.S. Pat. No. 5,151,623 issued Sep. 29, 1992 to Om P. Agrawal, and entitled, PROGRAMMABLE LOGIC DEVICE WITH MULTIPLE, FLEXIBLE ASYNCHRONOUS PROGRAMMABLE LOGIC BLOCKS INTERCONNECTED BY A HIGH SPEED SWITCH MATRIX; and (C) U.S. Pat. No. 5,185,706 issued Feb. 9, 1993 to Om P. Agrawal, et al, and entitled, PROGRAMMABLE GATE ARRAY WITH LOGIC CELLS HAVING CONFIGURABLE OUTPUT ENABLE; and (D) U.S. Pat. No. 5,212,652 issued May 18, 1993 to Om P. Agrawal et al., and entitled PROGRAMMABLE GATE ARRAY WITH IMPROVED INTERCONNECT STRUCTURE;

Description of the Related Art

The below disclosed invention covers two, apparently unrelated areas: (1) user-programmable devices and (2) board-level re-design. These areas (1)–(2) will be discussed individually by way of background; and then the cross-link between the two areas will become apparent as the invention is unveiled.

User Programmable Devices

A variety of user-programmable devices (UPD's) are now available in the market. UPD's first became popular with the introduction field-programmable logic array devices (FPLA's) and programmable array-logic devices (PAL's) such as the Advanced Micro Devices 22V10. In these early devices, users were able to program logic functions into already-manufactured and packaged integrated circuit chips (IC's) by blowing addressable fuses.

A more sophisticated class of user-programmable devices (UPD's) emerged with the introduction of the XC2000 and XC3000 families of field-programmable gate array devices by Xilinx Inc. of San Jose, Calif. A description of the XC2000 series, as well as related programmable logic device art, can be found in THE PROGRAMMABLE GATE ARRAY DESIGN HANDBOOK, First Edition, published by Xilinx, pages 1-1 through 1-31. The architecture for the XC3000 family is provided in a technical data handbook published by Xilinx entitled XC3000 LOGIC CELL ARRAY FAMILY, pages 1–31. Each of these Xilinx publications is incorporated by reference in this application as providing a description of the prior art.

The prior art in programmable gate arrays is further exemplified by U.S. Pat. Nos. 4,642,487; 4,706,216; 4,713, 557; and 4,758,985; each of which is assigned to Xilinx, Inc. These U.S. patents are incorporated by reference as setting forth detailed descriptions of the programmable gate array architecture and implementations of the same.

In brief, a field-programmable gate array device can be characterized as a monolithic integrated circuit having four major architectural features: (1) a user-configurable memory means (SRAM, EEPROM, anti-fuse, or other) for storing user-provided configuration instructions; (2) a plurality of Input/Output Blocks (IOB's) for interconnecting internal circuits of the FPGA device with external circuitry and/or with other IOB's of the FPGA device and/or with other internal circuit components of the FPGA device; (3) a plurality of Configurable Logic Blocks (CLB's) for carrying out user-programmed logic functions that are stored within the user-configurable memory means; and (4) a Configurable Interconnect Network (CIN) for routing signals within the FPGA device between the IOB's and the CLB's in accordance with user-programmed routing instructions that are also stored within the user-configurable memory means.

The CIN (Configurable Interconnect Network) of an FPGA device is itself divisible into two or more major architectural subdivisions which may be categorized as: (4a) a General Interconnect Network (GIN) which provides signal routing paths between any CLB and any other CLB or IOB by way of a gridwork of short-haul conductors and switching matrix blocks interposed at intersections of the gridwork; (4b) a Longline Interconnect Network (LIN) which provides signal routing paths between select groups of CLB's by way of one or more long-haul conductors placed adjacent to the CLB's of each select group; and (4c) a Direct Interconnect Network (DIN) which provides signal routing paths between immediately adjacent CLB's.

One shortcoming of a General Interconnect Network (GIN) is that it usually adds substantial delay to the propagation of signals carried over its user-configured routing paths. The amount of delay varies with the number of switching matrix blocks and the number of short-haul conductors used to route a signal between various circuit points. Each switching matrix block of the GIN includes at least one, and usually more, programmable switches (e.g., field-effect pass transistors) which add capacitance to the GIN routing path and thereby increases its signal propagation time.

The Longline Interconnect Network (LIN) is included in most designs for the purpose of overcoming the slow propagation times of the GIN. If the gridwork of short-haul conductors in the GIN is analogized to local streets in a city, with the switching matrix blocks of the GIN acting as speed-reducing stop signs at every street corner, the LIN can be analogized to a high speed freeway which can carry signals much more quickly across town (e.g., from one side of the integrated circuit chip to an opposed side).

The problem with a Longline Interconnect Network (LIN), however, is that it provides a relatively limited amount of signal routing. Practical considerations constrain the number of long-haul conductors that may be provided on the finite surface area of an FPGA device. The number, and positioning of long-haul conductors (longlines) has to be selected judiciously. Also, the number of, and distance between, signal entry/exit points on each long-haul conductor (each longline) need to be chosen carefully. If too many signal entry/exit points are provided on a given longline, the signal propagation speed of the longline will suffer because each signal entry/exit point adds more capacitance to the longline. If signal entry/exit points are positioned in the wrong places relative to adjacent CLB's of the longline, it may not be possible to couple a desired signal from one CLB to the longline and to speed the transmission of the signal to a distant other CLB within a required time span.

The above considerations have resulted in limited use of the Longline Interconnect Network (LIN) of FPGA's.

Board Level Rerouting of Bus Signals

One of the truly advantageous features of static-RAM based, user-programmable devices (UPD's) such as the Xilinx or AT&T or Altera FPGA devices is that their internal signal routing paths and/or logic functions can be conveniently changed with each engineering re-design. One simply introduces new configuration data into the user-configurable memory means (SRAM).

The same is unfortunately not true for printed circuit boards, especially the multi-layer kind. If the edge connections of a printed circuit board (PCB) have already been specified, and the positionings (placement) on the PCB of various integrated circuit chips (IC's) have been chosen, and moreover, the pinouts of the IC's have been defined, and the layout for traces interconnecting specific pins of the IC's have also been designed; it is very difficult and expensive at that point in the design process to make major revisions, at the board-level, to the design of the on-board circuit. This is particularly so in modern, high-frequency designs where the time for signal propagation through board-level interconnect is critical and special attention has to be paid to the timing relationships of time-parallel pulses that travel side-by-side in multi-line buses.

It is not uncommon to find situations where an engineering re-design is requested and the re-design calls for a change in bus routing between IC chips. An on-board multi-line bus that ran to subcircuit A may have to be rerouted to subcircuit B. This can create major difficulties if printed circuit boards have already been designed and mass-produced. A re-design might disadvantageously require the discard of already produced boards and a manufacture of a large batch of new boards.

SUMMARY OF THE INVENTION

The invention overcomes the above-mentioned problems by providing a method and on-chip architecture for multiplexing signals from selected external interconnect buses to chip internal buses such that bus rerouting can be implemented programmably within a user-programmable device without substantially affecting timing relations between time-parallel signals of a rerouted bus.

A structure in accordance with the invention comprises: (a) a monolithic substrate having logic and interconnect circuitry provided thereon; (b) a plurality of first through Nth Input/Output Blocks (IOB's) provided on the substrate for receiving output signals of the substrate interconnect circuitry and coupling the output signals to points outside the substrate, and/or receiving input signals from points outside the substrate and supplying the received input signals to the substrate interconnect circuitry; (c) where the substrate interconnect circuitry includes at least one longline bus extending over or next to the plural IOB's, the longline bus having first through Mth longlines; (d) bus multiplexing means for selectively coupling respective ones of the first through Nth IOB's to respective ones of the first through Mth longlines, the bus multiplexing means providing selective coupling between at least one of the longlines and a programmably selected one or the other of two IOB's such that signal propagation delay between the at least one longline and the programmably selected one or the other of two IOB's is substantially the same irrespective of which of the two IOB's is selected; and (e) a plurality of logic blocks (CLB's) operatively coupled to respective ones of the first through Mth longlines.

A method in accordance with the invention comprises the steps of: (a) providing a printed circuit board having first and second signal buses with fixed routing and a programmable integrated circuit package having I/O terminals of fixed position coupled to the first and second signal buses; (b) providing within the programmable integrated circuit package, first and second logic subcircuits; (c) providing within the programmable integrated circuit package, a user-programmable switching matrix which is operatively coupled to the package I/O terminals, for programmably interconnecting each of the first and second logic subcircuits to either one of the first and second signal buses; wherein signal propagation time between the package I/O terminals and the first and second logic subcircuits is substantially the same irrespective of which of the first and second signal buses is programmably interconnected to the first and second logic subcircuits within the integrated circuit package; and (d) programming the user-programmable switching matrix to provide a desired interconnection between the package I/O terminals and the first and second logic subcircuits within the integrated circuit package.

BRIEF DESCRIPTION OF THE DRAWINGS

The below detailed description makes reference to the accompanying drawings, in which:

FIGS. 5A–5B are schematics of IOB to adjacent bus couplings in the eight-by-eight CLB array of FIG. 4;

DETAILED DESCRIPTION

Figure 1:
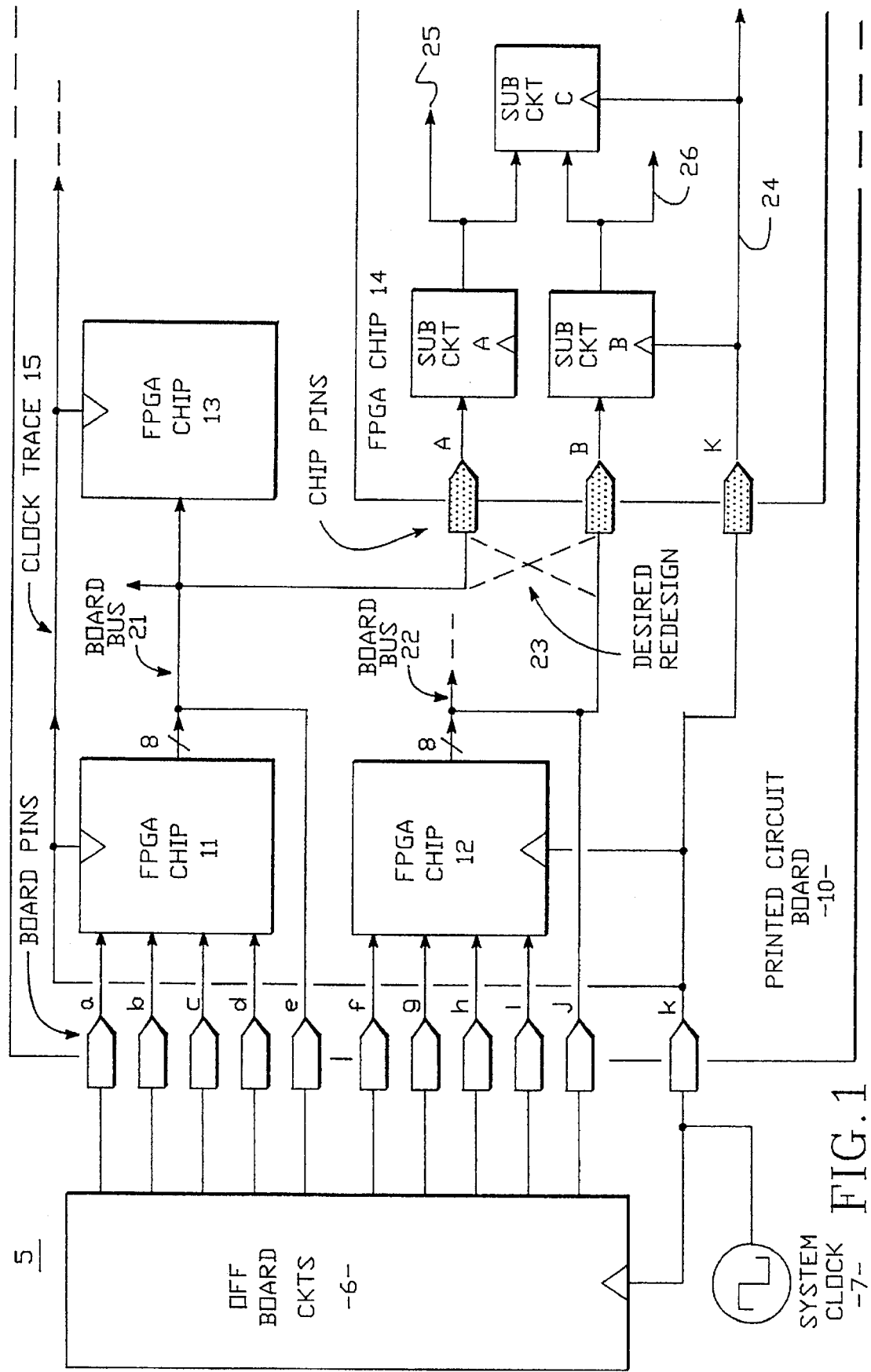
FIG. 1 is a block diagram showing an illustrative board-level re-design problem.

FIG. 1 is a block diagram of an illustrative re-design problem.

In the illustrative re-design problem of FIG. 1, a synchronous digital system 5 is to be mass-produced at minimal cost. The digital system 5 is to include a main printed circuit board (motherboard) 10 and one or more off-board circuits 6. A system clock 7 is provided for supplying system timing pulses to the printed circuit board 10 and the off-board circuits 6.

Board 10 is shown to have been already designed such that it will fixedly support a predefined number of integrated circuit chips, 11, 12, 13, 14, etc. at predetermined positions on the surface of the board 10. A plurality of board-interconnect pins, "a" through "k", have already been designed to be fixedly positioned along an edge of the board.

For the sake of example, it is assumed that each of IC chips 11–14 is a field-programmable gate array (FPGA) device. It is further assumed that the function of each of board pins a–k has been prespecified by a fixed system design and the physical position and function of each of these board pins a–k cannot be changed.

As seen, board pins a–d provide input signals to FPGA chip 11. An 8-bit wide output bus of FPGA chip 11 is brought out by way of an 8-bit wide board-bus 21 to supply a return signal to one or more board interconnect pins, e. Board-bus 21 also extends to FPGA chips 13, 14 and to other unshown integrated circuits of board 10. (Note: Although a single board-pin symbol is shown at e, it is understood that this symbol can represent a plurality of board pins. Similarly, each of the symbols for board pins a–d can represent a plurality of board pins. Only one is shown at each position for the sake of illustrative brevity.)

As further seen, board pins f–i supply further input signals from the edge of board 10 to FPGA chip 12. An 8-bit wide output board-bus 22 that extends from IC chip 12 supplies a response signal to one or more edge connectors, j. Board-bus 22 also extends to FPGA chip 14 and to other unshown integrated circuits of board 10.

Board pin k supplies timing pulses of the system clock 7 to all synchronous circuits of printed circuit board 10, including FPGA chips 11–14. It is assumed here that digital system 5 is a high speed circuit. Signal propagation timings are critical. As such, related pulses on board input lines a–d need to arrive concurrently at the input interface of FPGA chip 11 and in synchronism with a contemporaneously arriving system clock pulse of board line k. Similar, strict timing requirements are imposed for output pulses on board bus 21 (which connects to board edge pin e), on board lines f–i, and on board bus 22 (which connects to board edge connector j).

According to a first design, the printed board traces of board bus 21 connect to a first set A of chip pins on FPGA chip 14. Board bus 22 connects to a second set B of chip interconnect pins provided on FPGA chip 14. FPGA chip 14 is configured to have a plurality of internal logic subcircuits A, B and C. An interconnect network is provided within FPGA chip 14 for connecting chip pin set A to logic subcircuit A and for connecting chip pin set B to logic subcircuit B. The interconnect network of FPGA chip 14 further connects the outputs of subcircuits A and B to the inputs of logic subcircuit C.

Each of logic subcircuits A, B and C is programmably defined within FPGA chip 14 such that each subcircuits A, B and C needs to operate in synchronism with timing pulses provided through a chip interconnect pin K and over a clock distributing line 24 included in FPGA chip 14. It is critical that the output signals of subcircuits A and B arrive in synchronism with one another as they enter subcircuit C.

Although not shown, it is to be understood that for the illustrative re-design problem, each of the shown FPGA chips 11–14 and subcircuits A–C connect not only to one another as described above, but also to many other on-board chips and other on-chip subcircuits. Arrow-terminated lines 25 and 26 indicate that respective subcircuits A and B connect not only to logic subcircuit C but also to other, unshown portions of FPGA chip 14. It is to be further understood that the design of digital system 5 can be quite complex. Significant effort may have been expended in choosing the placement (positionings) of various integrated circuit chips 11–14, etc. on the printed board 10 and in choosing the placement (positionings) of various logic subcircuits A–C, etc. inside each integrated circuit chip. Significant further effort may have been expended in routing various interconnect lines and buses through printed board 10 and internally through the various integrated circuit chips 11–14, etc.

It is extremely difficult at this point in the illustrative re-design problem to make any major, global changes to the placement of on-board chips and/or to the placement of on-chip subcircuits. It is similarly difficult to make any major, global changes to the already-designed, board-level parallel-signal routing paths (e.g., board-buses 21, 22) and to the corresponding chip-internal bus-wide signal routing paths.

For reasons that are not important to the present discussion, assume that it is nonetheless necessary to make a change in the board-level routing of buses 21 and 22 as indicated by the dashed lines at 23 so that board bus 21 is rerouted to chip pin set B of IC 14 and board bus 22 is rerouted to chip pin set A of IC 14.

One additional dilemma is added to the illustrative re-design problem of FIG. 1 in order to make the situation more interesting. A large number of multilayer printed circuit boards have been produced at considerable expense, each with the wiring pattern that is shown by solid lines in FIG. 1.

The problem at hand is how to make the desired re-design 23 without manufacturing a new set of printed circuit boards. It is not a trivial problem if one recalls that signal propagation timings are critical in digital system 5 and various, inter-related pulses on the board-buses and chip-internal interconnect-lines need to arrive concurrently at the various circuit points in synchronism with the system clock pulses of board line k. An attempt might be made to reconfigure FPGA chip 14 such that the placements of subcircuits A and B are reversed. But then there is the problem of what to do with the remaining circuitry of FPGA chip 14 that connects to arrow-terminated lines 25 and 26.

In accordance with the invention, bus-rerouting means are provided within an FPGA chip such as chip 14 so that the desired bus rerouting 23 can be programmably implemented within the chip rather than on the printed circuit board 10, and such that signal propagation delays for signals on rerouted buses are substantially unchanged.

Figure 2A:
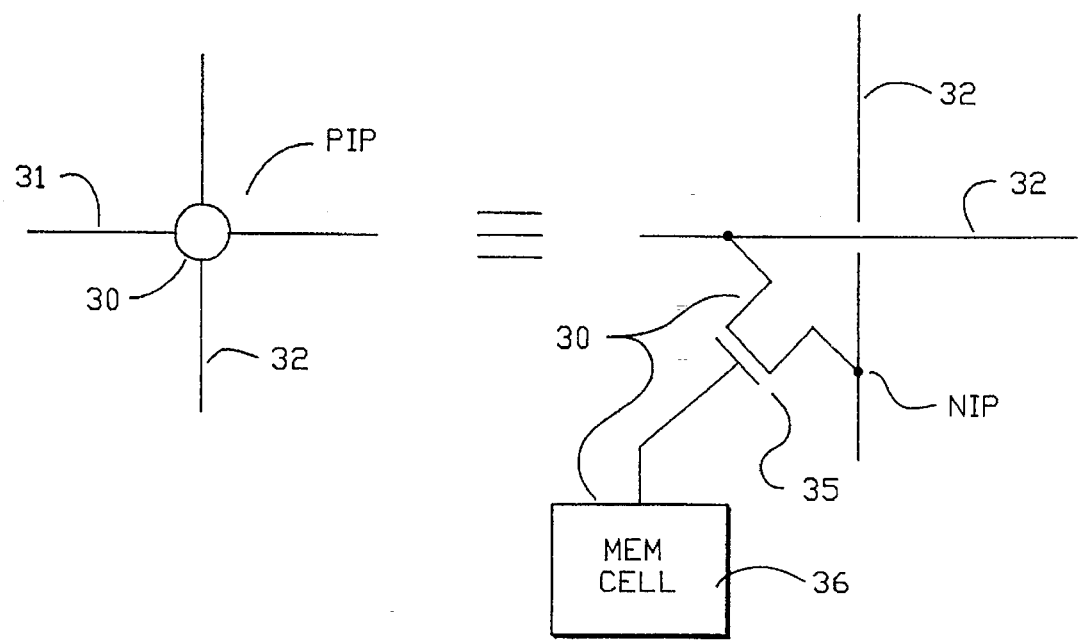
FIG. 2A is a legend explaining a symbol used to represent a PIP (Programmable Interconnect Point)

FIG. 2A shows a first symbol that is used in explaining the invention. The unshaded circle 30 shown at the intersection of horizontal line 31 and vertical line 32 represents a so-called Programmable Interconnect Point (PIP). A PIP is a user-configurable device which may be used to provide a conductive path between its underlying horizontal and vertical lines 31, 32 or to leave an open between those lines 31, 32.

In one embodiment, a PIP is implemented by providing a field effect pass transistor 35 having source and drains fixedly connected to respective ones of the horizontal and vertical lines 31, 32. (The dark shaded small circles represents a nonprogrammable interconnect points or NIP's for short.) The gate of the illustrated pass transistor 35 is driven by a user-programmable memory cell 36. Memory cell 36 can be a user-addressable SRAM (Static Random Access Memory) cell or a DRAM (Dynamic RAM) cell or some other form of user-programmable memory such as a UVPROM (UltraViolet-erasable Programmable ROM). When the memory cell 36 is in a first logic state (e.g., logic high ("1")), the pass transistor 35 becomes conductive. When the memory cell 36 is in an opposed, second logic state (e.g., logic low ("0")), the pass transistor 35 is non-conductive.

PIP's 30 may be implemented with other devices such as user-blowable fuses, user-formable antifuses and Flash EEPROM. (The latter refers to Electrically Erasable and reProgrammable nonvolatile memory devices that maintain data without power much like early ROM devices. Flash refers to the ability to quickly erase many such cells.)

Figure 2B:
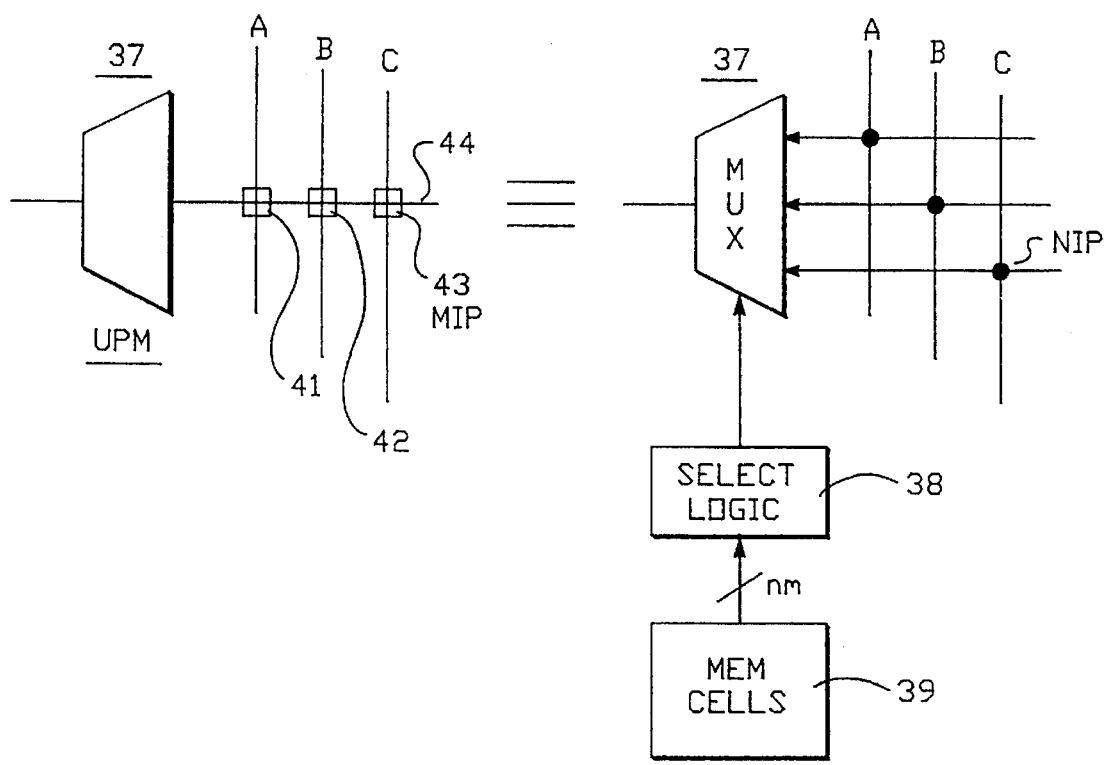
FIG. 2B is a legend explaining a symbol used to represent a programmable multiplexer.

FIG. 2B shows the logic symbol for another device 37 that is used in explaining the invention. The device 37 is a user-programmable multiplexer or "UPM" for short. Internally transparent square boxes 41, 42, 43 are used to represent the input connections of a UPM. Horizontal line 44 represents an input bus of the UPM 37. A UPM 37 can be implemented by providing PIP's distributed across input bus 44 and positioned at the locations of the open square boxes 41–43. Appropriate select logic may be used to minimize the number, nm, of user-programmable memory cells or fuses that are necessary to implement a multiplexer function. As seen at the right side of FIG. 2B, a number nm of memory cells 39 are coupled by way of select logic 38 to the selection control port of a multiplexer. The signal present at a memory-selected one of input terminals A, B or C is coupled to the output of the multiplexer. (It is to be understood that user-blowable fuses or user-activated anti-fuses may be used in place of memory cells 39.)

Each user-selectable multiplexer input such as represented by one of square boxes 41–43 will be later referred to as a "MIP" (user-selectable Multiplexer Input Point).

Figure 3:
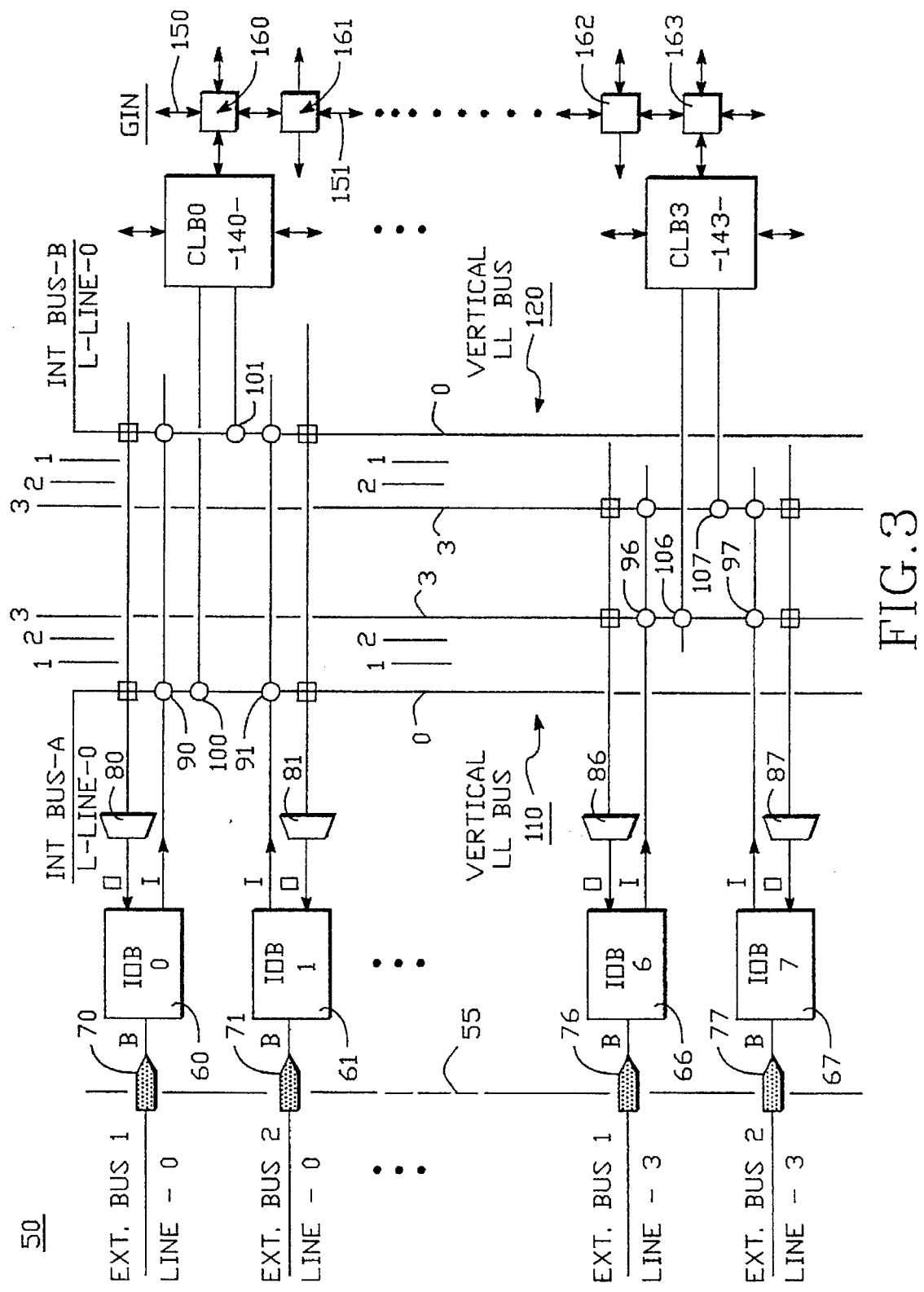
FIG. 3 is a schematic of a first chip-internal bus-multiplexing scheme in accordance with the invention.

FIG. 3 uses the logic symbols 30, 37 of FIGS. 2A and 2B to show a first FPGA chip 50 having an on-chip bus multiplexing circuit in accordance with the invention. Interface line 55 represents the boundary between off-chip circuitry (left side) and chip-internal circuitry (right side) of FPGA chip 50. A plurality of chip interconnect pins 70–77 are provided at the chip interface 55 for coupling signals between off-chip and on-chip circuits. The illustrated example assumes that there are eight such chip interconnect pins 70–77, but shows only the first two and last two for purposes of graphic clarity. It is to be understood that the invention contemplates embodiments having other numbers of chip interconnect pins.

Each of the chip interconnect pins 70–77 connects to a corresponding one of a plurality of input/output blocks (IOB's) 60–67. The illustrated example assumes that there are eight such IOB's 60–67, but shows only the first two and last two, again for purposes of graphic clarity. Each IOB 60–67 has a bidirectional (B) terminal connected to its respective chip pin 70–77, an input (I) terminal for transmitting input signals deeper into the chip 50 and an output (O) terminal for outputting signals from the chip 50 to its respective chip pin 70–77. IOB's 60 through 67 will also be referred to as IOB-0 through IOB-7.

IOB's 60–67 are positioned adjacent to two vertical longline buses, 110 and 120. The illustrated example assumes that there are four longlines, numbered LL-0 through LL-3, in each of longline buses, 110 and 120. It is to be understood, of course, that the invention contemplates embodiments having other numbers of longline buses where each such bus can have other numbers of longlines.

Longline buses 110 and 120 form a peripheral portion of a Longline Interconnect Network (LIN) of FPGA chip 50. Although not shown, the Longline Interconnect Network (LIN) of chip 50 further includes a gridwork of overlapping horizontal and vertical longlines provided at a core portion of FPGA chip 50.

A plurality of user-configurable logic blocks (CLB's) 140–143 are further positioned at the periphery of FPGA chip 50 and adjacent to vertical longline buses 110 and 120. The illustrated example assumes that there are four peripheral CLB's, numbered 140 through 143. (These peripheral CLB's 140–143 are also referred to later as CLB-0 through CLB-3.) It is to be understood that the invention contemplates embodiments having other numbers of peripheral CLB's and that the FPGA chip 50 also has a plurality of other internal or "core" CLB's (not shown) that can be programmably interconnected to the peripheral CLB's 140–143.

Part of a General Interconnect Network (GIN) is shown at the right side of FIG. 3 as being comprised of short-haul conductors 150, 151, etc. and switch matrix units 160, 161, etc. The peripheral CLB's 140–143 can be programmably coupled to any of the core CLB's (not shown) at least by way of the General Interconnect Network (GIN 150, 160). A Direct Interconnect Network (DIN, not shown) may also be included in FPGA chip 50 for programmably connecting the peripheral CLB's 140–143 to neighboring ones of the core CLB's (not shown).

The (O) output terminal of each of IOB's 60–67 is programmably coupled to longline buses 110 and 120 by a corresponding one of user-programmable multiplexers (UPM's) 80–87. More specifically, UPM 80 (also referred to as UPM-0 below) permits users to programmably couple the (O) output terminal of IOB-0 either to longline LL-0 of longline bus 110 or to longline LL-0 of longline bus 120. UPM 81 (also referred to as UPM-1) permits users to programmably couple the (O) output terminal of IOB-1 either to longline LL-0 of longline bus 110 or to longline LL-0 of longline bus 120.

Although not shown, it is to be understood that a UPM 82 (also referred to as UPM-2) is provided for permitting users to programmably couple the (O) output terminal of IOB-2 (not shown) either to longline LL-1 of longline bus 110 or to longline LL-1 of longline bus 120. Yet another UPM 83 (also referred to as UPM-3) is provided for permitting users to programmably couple the (O) output terminal of IOB-3 either to longline LL-1 of longline bus 110 or to longline LL-1 of longline bus 120.

In similar fashion, and again understood but not shown, a UPM 84 (also referred to as UPM-4) is provided for permitting users to programmably couple the (O) output terminal of IOB-4 (not shown) either to longline LL-2 of longline bus 110 or to longline LL-2 of longline bus 120. Yet another UPM 85 (also referred to as UPM-5) is provided for permitting users to programmably couple the (O) output terminal of IOB-5 either to longline LL-2 of longline bus 110 or to longline LL-2 of longline bus 120.

And as seen at the bottom of FIG. 3, a UPM 86 (also denoted as UPM-6) is provided for permitting users to programmably couple the (O) output terminal of IOB-6 either to longline LL-3 of longline bus 110 or to longline LL-3 of longline bus 120. Yet another UPM 87 (also denoted as UPM-7) is provided for permitting users to programmably couple the (O) output terminal of IOB-7 either to longline LL-3 of longline bus 110 or to longline LL-3 of longline bus 120.

In summary of the above, for each IOB-x, where x is an integer, a UPM-x is provided for programmably connecting the (O) output terminal of IOB-x either to a longline LL-INT(x/m) of longline bus 110 or to a longline LL-INT (x/m) of longline bus 120. In the immediately-preceding expressions, INT is the integer function which returns only the integer portion of its enclosed expression, and m is a distribution integer equal to or greater than two. The above example used a value of m=2. It will be seen below that values greater than 2 are also within the scope of the invention.

A key feature to be appreciated now is that IOB's 60–67 have substantially equal signal propagation delays and UPM's 80–87 have substantially equal signal propagation delays. Loadings on each of longlines LL-0 through LL-3 is substantially the same and uniformly distributed for each of the chip-internal longline buses, 110 and 120.

As such, a signal on each longline LL-x can be programmably routed for output from FPGA chip 50, with substantially the same delay, through one or another or all of IOB-INT(x/m) through IOB-INT[(x/m)+m−1].

In the example of FIG. 3, there are m=2 IOB's programmably coupled to each of longlines LL-0 through LL-3. A signal on longline LL-0 (of either of longline buses 110 and 120) can be routed, with substantially the same delay, through one or the other or both of IOB-0 and IOB-1 for output on respective chip pins 70 and/or 71. Similarly, a signal on longline LL-3 (of either of longline buses 110 and 120) can be routed, with substantially the same delay, through one or the other or both of IOB-6 and IOB-7 for output on respective chip pins 76 and/or 77. Although not shown, it is understood that the same applies to coupling a signal from longline LL-1 to IOB-2 and IOB-3 and for coupling a signal from longline LL-2 to IOB-4 and IOB-5.

The same concept is used in providing programmable coupling between the (I) input terminal of each of IOB's 60–67 and longline buses 110 and 120 by way of corresponding interconnections of user-programmable interconnect points (PIP's) 90–97. The PIP's 90–97 are also referenced as PIP-0 through PIP-7. Each PIP on FPGA chip 50 has substantially the same signal propagation delay. For each IOB-x, where x is an integer, a PIP-x is provided for programmably connecting the (I) input terminal of IOB-x either to a longline LL-INT(x/m) of longline bus 110 or to a longline LL-INT(x/m) of longline bus 120. Thus, a signal that is to be routed from outside of FPGA chip 50 to a given longline LL-x can be programmably routed for input, with substantially the same delay, through one or another of IOB-INT(x/m) through IOB-INT[(x/m)+m−1].

Since in the example of FIG. 3, there are m=2 IOB's programmably coupled to each of longlines LL-0 through LL-3, a signal that is to be input to longline LL-0 (of either of longline buses 110 and 120) can be so routed, with substantially the same delay, through one or the other of chip pins 70 or 71 and transmitted through a respective one of, IOB-0 (60) or IOB-1 (61), and PIP-0 (90) or PIP-1 (91).

A further plurality of PIP's 100–107 are provided for programmably connecting CLB's 140–143 to longlines LL-0 through LL-3 of longline buses 110 and 120. More specifically, CLB 140 (peripheral CLB-0) can be programmably coupled to longline LL-0 of the first vertical longline bus 110 by means of PIP 100 and to longline LL-0 of the second vertical longline bus 120 by means of PIP 101. Although not shown, it is understood that CLB 141 (peripheral CLB-1) can be programmably coupled to longline LL-1 of the first vertical longline bus 110 by means of a PIP 102 and to longline LL-0 of the second vertical longline bus 120 by means of another PIP 103. Although further not shown, it is understood that CLB 142 (peripheral CLB-2) can be programmably coupled to longline LL-2 of the first vertical longline bus 110 by means of a PIP 104 and to longline LL-2 of the second vertical longline bus 120 by means of another PIP 105. And as seen in FIG. 3, CLB 143 (peripheral CLB-3) can be programmably coupled to longline LL-3 of the first vertical longline bus 110 by means of PIP 106 and to longline LL-2 of the second vertical longline bus 120 by means of PIP 107.

Chip pins 70, 72 (not shown), 74 (not shown) and 76 may be connected as shown in FIG. 3 to respective lines 0 through 3 of a first chip-external bus (EXT BUS1) and chip pins 71, 73 (not shown), 75 (not shown) and 77 may be connected as shown in FIG. 3 to respective lines 0 through 3 of a second chip-external bus (EXT BUS2).

Given this arrangement, a bus signal traveling either on the first chip-external bus (EXT BUS1) or on the second chip-external bus (EXT BUS2) can be programmably routed, with substantially no change in signal propagation time, to either one of the chip-internal longline buses 110 and 120. A bus signal developed across outputs of CLB's 140–143 can be programmably routed, with substantially no change in signal propagation time, to either one of the first chip-external bus (EXT BUS1) or the second chip-external bus (EXT BUS2).

If CLB's 140–143 are subdivided into two subcircuits, with CLB's 140–141 forming a first subcircuit (A) and CLB's 142–143 forming a second subcircuit (B), then external bus signals can be programmably routed, with substantially no change in signal propagation time, between either of the first and second subcircuits and selected ones of chip pins 70–77. The illustrative re-design problem posed in FIG. 1 can be easily overcome with this arrangement.

Incidentally, a longline may be defined for the case of FIG. 3 as conductor that is coextensive with, and couplable to, a plurality of at least four CLB's (140–143) and at least two IOB's (60–61). A more general definition for a "longline" is a conductor which provides interconnection between CLB's that are separated by substantially greater distances than CLB's that can be interconnected to one another by a single short-haul conductor of the chip's General Interconnect Network (GIN).

Figure 4:
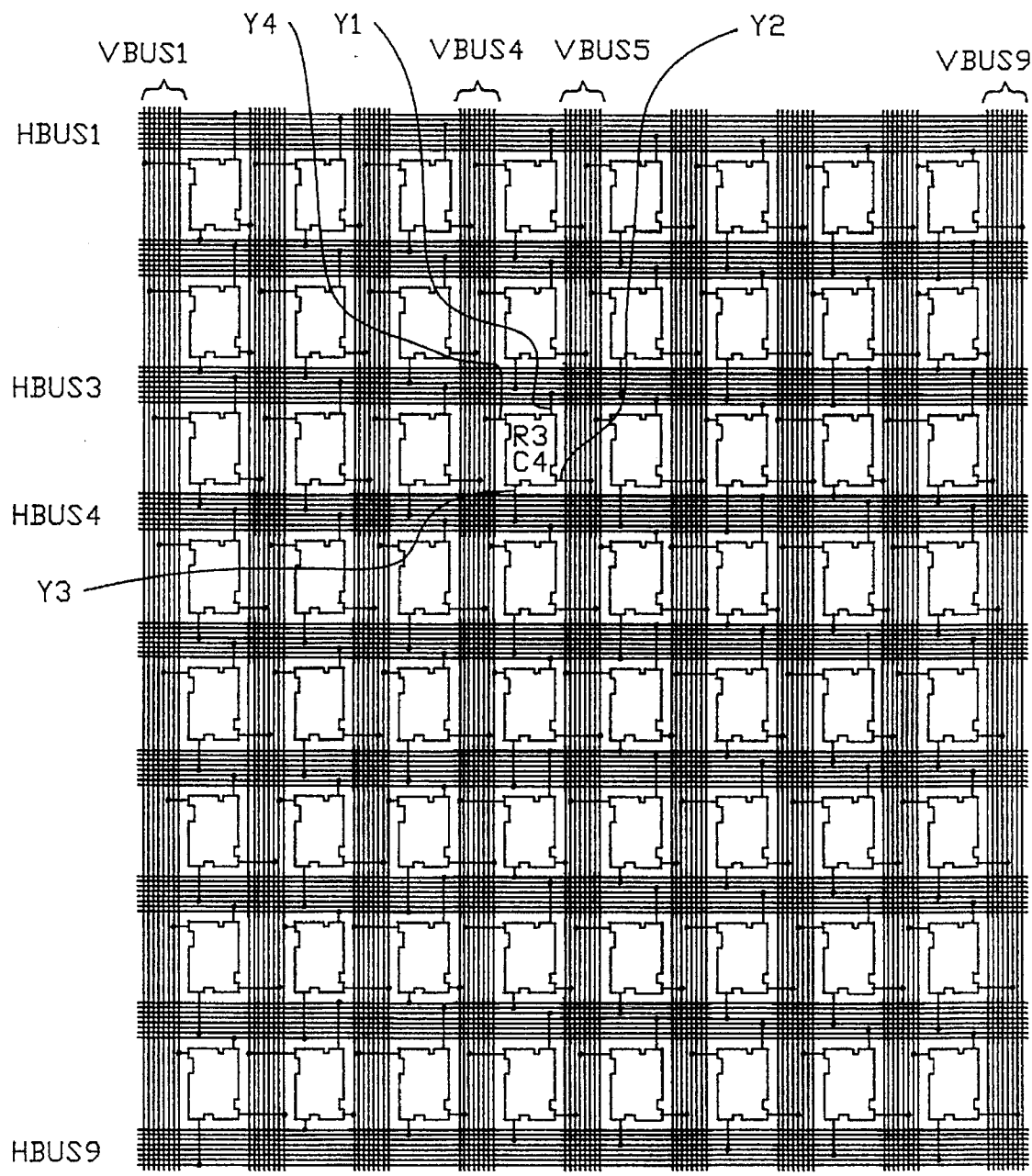
FIG. 4 is a schematic of an eight-by-eight CLB array in accordance with the invention.

FIG. 4 shows another embodiment 400 formed of an eight-by-eight array of CLB's symmetrically disposed in a matrix of nine vertical buses (VBUS1 through VBUS9) and nine horizontal buses (HBUS1 through HBUS9). Each vertical and horizontal bus includes a plurality of preferably at least eight longlines. The eight longlines are preferably "uncommitted" longlines, meaning that all interconnects to these longlines are programmable rather than fixed (nonprogrammable). Due to lack of space, solid dots are used in FIG. 4 to represent PIP's. Note that eight PIP connections are provided between the eight CLB's of column one in the CLB array and the eight uncommitted longlines of vertical bus VBUS1. This means that a data signal composed of eight bits (a byte) can be placed on VBUS1 and its eight bits can be programmably coupled to respective ones of the eight uncommitted longlines of VBUS1.

FIG. 5A shows further connections in the eight-by-eight embodiment 400 of FIG. 4. The vertical longlines numbered 18 through 25 are the same as the eight uncommitted longlines of VBUS1 that are shown in FIG. 4. Due to space constraints, squares without the trapezoidal multiplexer symbol of FIG. 2B are used to represent user-programmable multiplexer input connections (MIP's) and solid dots are used to represent PIP connections.

Note that there are 24 IOB's arranged as eight groups of 3 IOB's each. The topmost eight IOB's have programmable interconnections arranged in staggered fashion to respective ones of uncommitted longlines 18–25. The middle eight IOB's and bottom eight IOB's have similar programmable interconnections to respective ones of uncommitted longlines 18–25. Accordingly, if three external buses (not shown) each eight bits wide are coupled respectively to the topmost, middle and bottom groups of eight IOB's, any one of these three external buses can be programmably coupled to the eight CLB's of vertical column one of FIG. 4 with substantially similar signal propagation delay.

FIG. 5B shows similar programmable interconnections between vertical bus VBUS9 and a group of 24 IOB's on an opposed edge of the integrated circuit making up embodiment 400. Although not shown, it is to be understood that similar arrangements of IOB's and peripheral horizontal buses are provided at the top and bottom of the chip.

A longline may be defined for the case of FIGS. 4, 5A–5B 3 as conductor that is coextensive with, and couplable to, a plurality of at least eight CLB's and at least two groups of eight IOB's each. In general, longlines are distinguished over other conductors of a field-programmable gate array (FPGA) by their substantially longer length and coextensiveness with four or more CLB's.

Figure 6A:
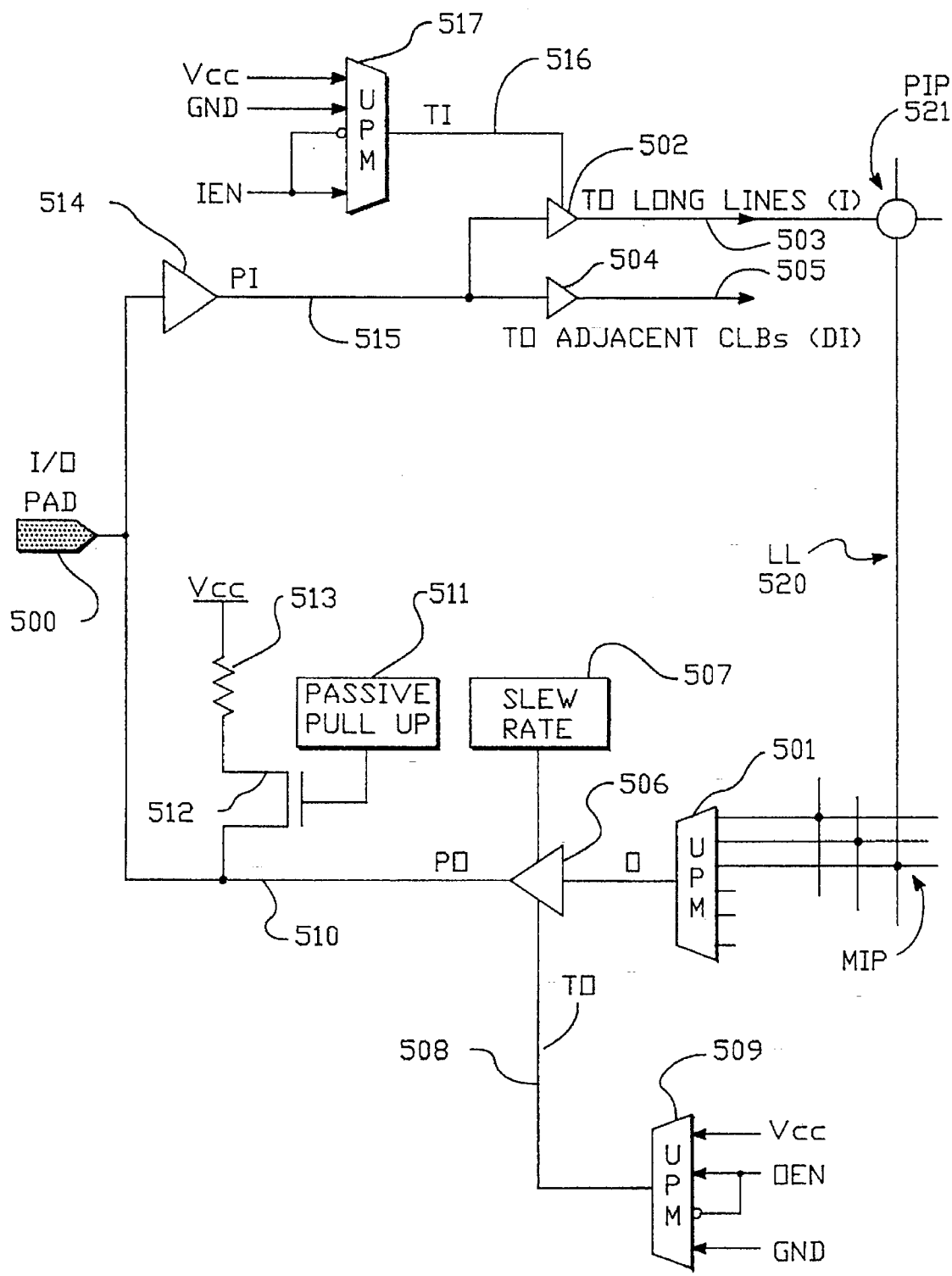
FIGS. 6A–6B are respectively, a schematic of a "simple" IOB and a more "complex" IOB that may be used in conjunction with the invention.
Figure 6B:
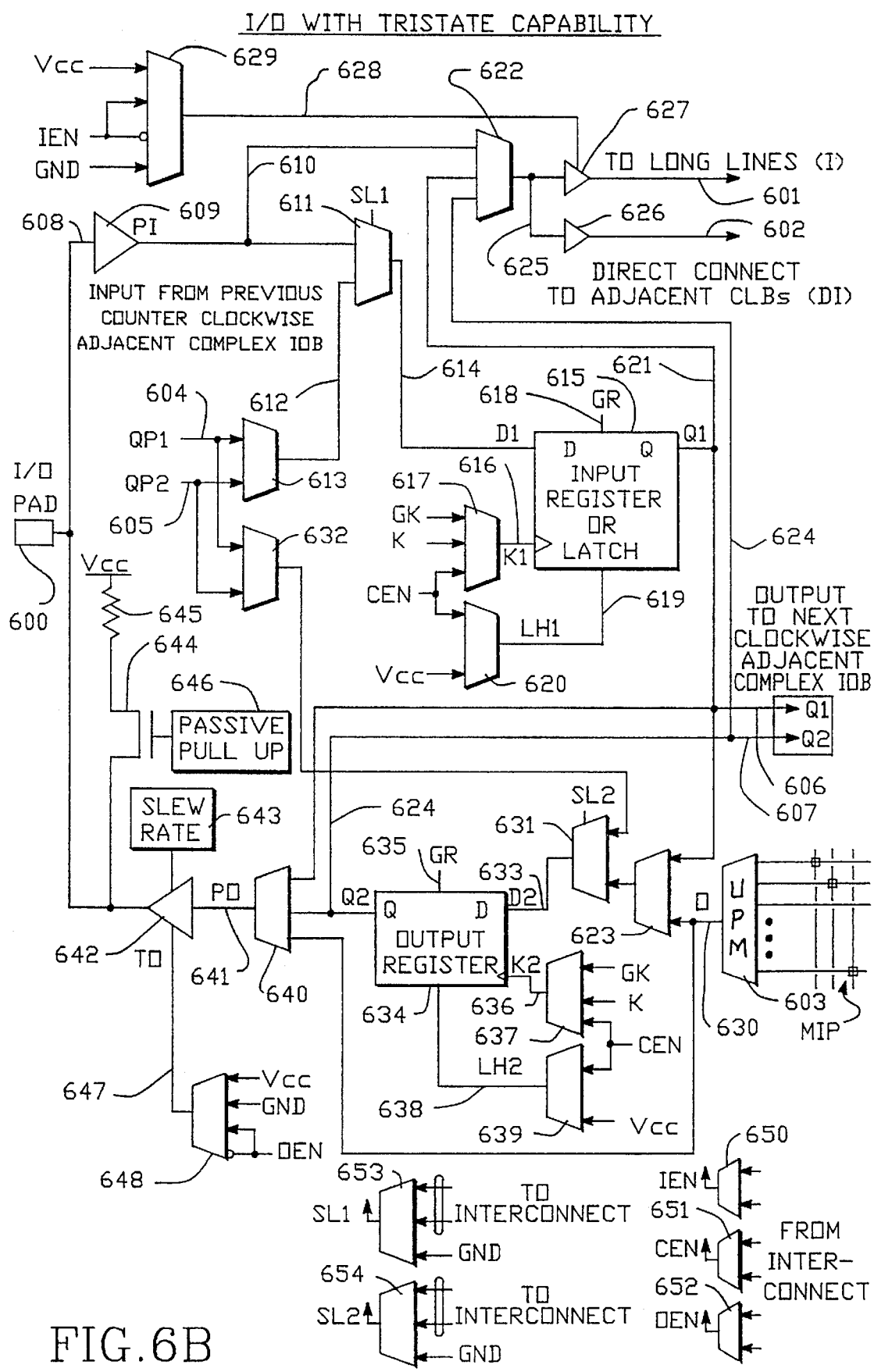

Referring to FIGS. 6A and 6B, the configurable input/output blocks (IOB's) in the programmable gate array 400 of FIG. 4 includes a mix of "simple" blocks such as the one shown in FIG. 6A and "complex" blocks such as the one shown in FIG. 6B. The mix varies with the goals of each design. In general, it has been found that a mix of two simple IOB's for each complex IOB works well. In FIGS. 5A–5B, each group of three IOB's consists of one complex IOB in the middle and two outside simple IOB's. The FPGA could include all simple IOB's or all complex IOB's, if desired.

Each input/output block (IOB), whether simple or complex, is coupled to memory cells in the configuration memory of the FPGA, the states of which control the configuration of the IOB. In general, these IOB's allow data to pass in two directions: (i) from an associated input/output pad of the integrated circuit chip to the Configurable Interconnect Network (CIN) and/or specific "peripheral" CLB's of the CLB array; (ii) from the Configurable Interconnect Network (CIN) and/or specific "peripheral" CLB's of the CLB array to the associated chip pad.

The configuration of an IOB sets the type of conditioning that signals passing through the IOB will receive. The pad associated with each IOB may or may not be bonded to a physical package pin.

The simple IOB shown in FIG. 6A has functions such as programmable pull-up (512), programmable slew rate (507) and tristate input/output (502/506) but no storage of passing through signals. The complex IOB shown in FIG. 6B provides an input register/latch and an output register in addition to the functions of the simple IOB. The complex IOB also has internal links for giving the user input register read-back at the package pin, and direct links to adjacent complex IOBs that allow data to be transferred to the registers of an adjacent IOB.

Note that the silicon die can be put into packages having more than, less than, or the same number of package pins as there are IOB pads on the die. If there are fewer package pins than IOB pads, then some IOBs may not be linked to a device package pins and so become buried IOBs for internal device use.

Referring to FIG. 6A, the illustrated simple IOB provides a configurable interconnection between its associated input/output pad 500 and the interconnect structure. The interconnect structure supplies chip output signals (O) to the inputs of user-programmable multiplexer (UPM) 501. The IOB supplies "nondirect" chip input signals (I) to an adjacent interconnect bus (e.g., VBUS1 of FIG. 4) over the output line 503 of tristate buffer 502. As seen, buffer output line 503 can be programmably coupled to a longline (LL) 520 of the adjacent bus by way of a PIP 521. "Direct" chip input signals (DI) are coupled to adjacent (peripheral) CLB's by way of output line 505 of buffer 504.

The specific inputs to user-programmable multiplexer (UPM) 501 are set out as follows. Each IOB has at least one input supplied from a "committed" long line (e.g., 520) on a bus which is perpendicular to the side of the chip on which the IOB is placed. Also, at least one input of UPM 501 is connected to the bidirectional general interconnect lines on the bus that runs parallel to the side and to an uncommitted long line on the bus parallel to the side. The UPM 501 also has at least two direct connect inputs coupling it directly to two adjacent (peripheral) CLB's.

The output of multiplexer 501 is supplied to tristate buffer 506. The tristate buffer 506 has a slew rate control circuit 507 for programmably controlling its slew rate as known in the art. Buffer 506 is also controlled by a tristate output control signal TO provided on line 508.

The tristate output control signal TO is supplied at the output of user-programmable multiplexer (UPM) 509. The inputs to multiplexer 509 are the power supply $V_{CC}$, the true and complement versions of an output-enable control signal OEN which is supplied as a control input to the IOB from the interconnect structure, and GROUND.

When tri-state buffer 506 is enabled, it outputs a slew-controlled pin output signal (PO) across line 510 to the chip I/O pad 500. Coupled to line 510 also is a programmable passive pull up circuit 511 which is configured in response to program data through transistor 512. A pull up resistor 513 is coupled from the output of transistor 512 to $V_{CC}$. Alternatively, transistor 512 can be of a resistive channel type for integrally providing both the switching function and the resistive coupling function. The function of pull-up control 511 can also be incorporated into transistor 512 by making transistor 512 as an EEPROM device (an electrically programmable floating gate transistor).

Signals input either from the I/O pad 500 or the output buffer 506 are routed into the chip interior through input buffer 514. The output (PI=pin input) of buffer 514 is supplied on line 515 as an input to direct output buffer 504 and to nondirect output buffer 502. The nondirect output buffer 502 is a tristate buffer whose tri-state function is controlled by a tristate input control signal TI on line 516. The tristate input control signal TI on line 516 is generated at the output of user-programmable multiplexer (UPM) 517. The inputs to multiplexer 517 are $V_{CC}$, the true and complement of an input-enable control signal IEN which is supplied as input to the IO block, and GROUND (GND).

The user-programmable multiplexers (UPM's) 501, 509, and 517 are each controlled by memory cells (not shown) in the configuration memory.

The signal that is supplied as an input to buffer 514 can be derived from three sources: the package pin coupled to the I/O pad 500, the output PO of the output buffer on line 510, or a high level created by the passive pull up circuit 511–513.

The multiplexer 517 generates the TI control signal from four sources. When $V_{CC}$ is selected, the nondirect tri-state buffer 502 is permanently enabled. When GROUND (GND) is selected, buffer 502 is permanently disabled and does not switch during operation of the programmable gate array, which could cause wasted current drain. When the multiplexer 517 is configured to select the IEN control signal in either its true or complement form, the buffer 502 is dynamically controlled in response to the IEN control signal.

Multiplexer 501 has at least six inputs in the preferred system. Two of the inputs come from nearby configurable logic blocks as direct connects, the remaining come from the programmable general interconnect structure.

The output enable control signal TO on line 508 comes from $V_{CC}$, OEN or GROUND. When $V_{CC}$ is selected, buffer 506 is permanently enabled. When GROUND is selected, buffer 506 is permanently disabled. When OEN is selected, in either its true or complement forms, buffer 506 is dynamically controlled.

The passive pull up 511 for the output link 510 is controlled by memory cell 511. When enabled, it ensures that the pad or package pin does not float when it is not used in an application.

FIG. 6B illustrates a complex IOB. Unless otherwise stated, each illustrated multiplexer is a user-programmable multiplexer (UPM). The complex IOB provides configurable data paths from its associated I/O pad 600 to the interconnect and adjacent CLB's across lines 601 and 602, and from the interconnect which is coupled to the input multiplexer 603 to the I/O pad 600. In addition, the complex IOB is coupled to a counter-clockwise-adjacent complex IOB (as seen moving around the periphery of the field-programmable gate array chip) to receive input signals QP1 and QP2 at lines 604 and 605. Also, the IOB supplies as output the signals Q1 and Q2 to the next clockwise adjacent complex IOB on lines 606 and 607.

The input path includes line 608 which is connected from the I/O pad 600 as input to the input buffer 609. The input buffer drives a pin-input signal PI on line 610. The signal PI is coupled as a first input of multiplexer 611. The second input to multiplexer 611 is the output 612 of multiplexer 613. The inputs to multiplexer 613 include the signals QP1 and QP2.

Multiplexer 611 is controlled in response to an interconnect-provided signal SL1 to supply the signal D1 on line 614. Signal D1 is supplied at the data input of the input register/latch 615. The register/latch 615 is clocked by the output 616 of multiplexer 617. Inputs to multiplexer 617 include the control signals GK, K, and CEN which are supplied as inputs to the IOB. The register/latch further includes a global reset input 618 which receives the GR (global reset) signal, which is an input to the IOB. Also, a clock enable input signal LH1 is supplied on line 619 to the register/latch 615. This signal LH1 is supplied at the output of multiplexer 620. The inputs to multiplexer 620 include the CEN signal and $V_{CC}$.

The output Q1 of the register/latch 615 is supplied on line 621 as an input to multiplexer 622, as an input to multiplexer 623, and as the Q1 output signal on line 606, and input to the multiplexer 640.

A second input to multiplexer 622 is the PI (pin-input) signal on line 610. A third input to multiplexer 622 is the output of the output register on line 624 as described below. The output of multiplexer 622 is supplied to line 625. Line 625 is coupled as input to buffer 626 which drives line 602 to the direct connect, and as an input to buffer 627 which is a tristate buffer driving connections to the long lines on line 601. Buffer 627 is controlled by the tristate input signal on line 628. The signal on line 628 is supplied at the output of the 4:1 multiplexer 629. Inputs to the 4:1 multiplexer 629 include the $V_{CC}$ signal, IEN in its true and complement form, and GROUND.

The output path through the complex IOB is connected to receive the signal O on line 630 at the output of multiplexer 603. The signal O on line 630 is supplied as the second input to multiplexer 623. The output of multiplexer 623 is supplied as input to multiplexer 631. The second input to multiplexer 631 is supplied at the output of multiplexer 632. The inputs to multiplexer 632 are the QP1 and QP2 signals. The output of multiplexer 631 is the D2 signal on line 633. The D2 signal is coupled as data input to the output register 634.

The output register 634 is coupled to the global reset signal GR on line 635. It is clocked by the signal K2 on line 636 which is generated at the output of multiplexer 637. Inputs to multiplexer 637 include the global clock GK, the K signal, and the CEN signal. A clock enable signal LH2 is supplied on line 638 to the register 634. The source of the signal LH2 on line 638 is the multiplexer 639 which receives as input the CEN signal and $V_{CC}$.

The output of the register 634 is supplied to line 607, which drives the output Q2, and to line 624, which is coupled as a first input to multiplexer 640 and as an input to multiplexer 622. The second input to multiplexer 640 is the output Q1 of register/latch 615 on line 621. The third input to multiplexer 640 is the signal O on line 630.

The output of multiplexer 640 is the pin output signal PO on line 641. It is supplied through the tristate output buffer 642 to the IO pad 600. The tristate buffer includes a slew rate control circuit 643 as known in the art. Further, a pass transistor 644 and resistor 645 provide a pull up path to $V_{CC}$ at the output of buffer 642. This pull up path is enabled in response to the passive pull up circuit 646 which is implemented by a configuration memory cell. (Alternatively, if desired, transistor 644 can be an electrically-programmable floating gate device (EEPROM) with a resistive channel.)

The tristate buffer 642 is controlled by the tristate output signal TO on line 647. The signal is generated at the output of multiplexer 648 which receives four inputs. The inputs include $V_{CC}$, GROUND, and a true and complement version of the signal OEN.

Control signals K, GK, and GR are supplied directly from the interconnect structure. The control signals IEN, CEN and OEN are supplied at the output of respective multiplexers 650, 651, and 652, each of which receives two inputs from the general interconnect.

The signal on IEN gives the ability for dynamic control of the input path through the buffer 627.

The signal on OEN gives the ability for dynamic control of the output path through the output buffer 642.

The signal CEN can be used as a clock or as a clock enable signal.

The signals SL1 and SL2 are derived at the output of 3:1 multiplexers 653 and 654. Two of the inputs to the multiplexers 653 and 654 are derived from the interconnect structure as described below and the third is coupled to ground. The signal SL1 allows the input register of the IOB to be loaded with data either from the pad or from an adjacent counterclockwise complex IOB through QP1 or QP2. The signal SL2 allows the output register of the IOB to be loaded with data from either the output of MUX 623 or from the next adjacent counterclockwise IOB through QP1 or QP2.

The input register/latch 615 can be configured to operate either as a latch or a register, in response to a memory cell in the configuration memory. When the element operates as a register, data at the input D is transferred to the output Q on the rising edge of the clock signal K1 on line 616. When the element operates as a latch, any data change at D is seen at Q while the signal K1 is high. When K1 returns to the low state, the output Q is frozen in its present state and any change on D will not affect the condition of Q.

The slew rate control circuit 643 allows the output to either have a fast or a slow rise time subject to the state of the memory cell controlling that function.

Each of the multiplexers shown in FIG. 6B is a UPM, meaning that its selection is controlled by an unshown one or more memory cells, with the exception of multiplexers 611 and 631. These two multiplexers (611, 631) are controlled respectively by the signals SL1 and SL2. SL1 and SL2 are output from respective UPM's 653 and 654.

In operation, the input path receives a signal from the pad 600 on line 608 and passes it through buffer 609 to generate the signal PI on line 610. The signal PI is supplied as an input to the register load multiplexer 611 which is controlled by the control signal SL1. The second input to the multiplexer 611 is derived from the output of multiplexer 613 which allows the supplying of a signal from either the input register or the output register of a previous counterclockwise adjacent complex IOB. When the signal SL1 is not connected to any lines in the circuit, it defaults to the low state allowing the signal PI to pass through.

The output D1 of the multiplexer 611 is the data input to the input storage element 615. Thus, the source of data at the input storage element is either the IO pad, the output buffer 642, the high state generated by the passive pull up circuit 646, or the input or output register of the adjacent complex IOB. The contents of the input register/latch can be frozen by asserting the signal LH1. The input path also includes the multiplexer 622 which drives the output buffers 627 and 626. The inputs to the multiplexer 622 include the signal PI from the line 610, the signal Q1 at the output of the storage element 615, and the signal Q2 at the output of the output register 634. Thus, the input signals to the interconnect structure can be derived from the input register, the combinatorial signal on line PI or from the output register. This allows the options for a registered or combinatorial signal derived from the IO pad. It also allows a synchronized output signal which can be derived by driving the signal from the input register output Q1 through the output register 634 and across line 624 back to the input driving multiplexer 622.

The Q1 output of the input register 615 is also available as an input to the 3:1 multiplexer 640 driving the signal PO. This facilitates read back of an input signal as part of the user application. Further, the signal Q1 at the output of the input register is coupled as an input to the 2:1 multiplexer 623 to create the synchronization path and to the output pin Q1 for coupling to the next adjacent clockwise complex IOB.

The operation of the output path is similar to that of the input path. The signal O on line 630 derived from the multiplexer 603 comes from either adjacent CLBs or from the programmable general interconnect structure for routing to the pad 600. Through the multiplexing tree comprised of 623 and 631, the inputs to the output register can be derived from the signal QP1 and QP2 from the adjacent counterclockwise complex IOB, the output of the input register Q1 on line 621 or from the signal O. The signal PO which supplies the output signal to the output buffer 642 can be derived either from the output Q2 of the output register 634, the output Q1 of the input register 615, or from line 630 supplying the combinatorial signal O from the output of multiplexer 603.

The contents of the output register can be frozen by asserting the signal LH2 on line 638.

The output buffer 642 drives both the pad 600 and the input circuit across line 608. Thus, the IOB can be used as a buried structure when the pad is not bonded to a physical package pin.

Figure 7:
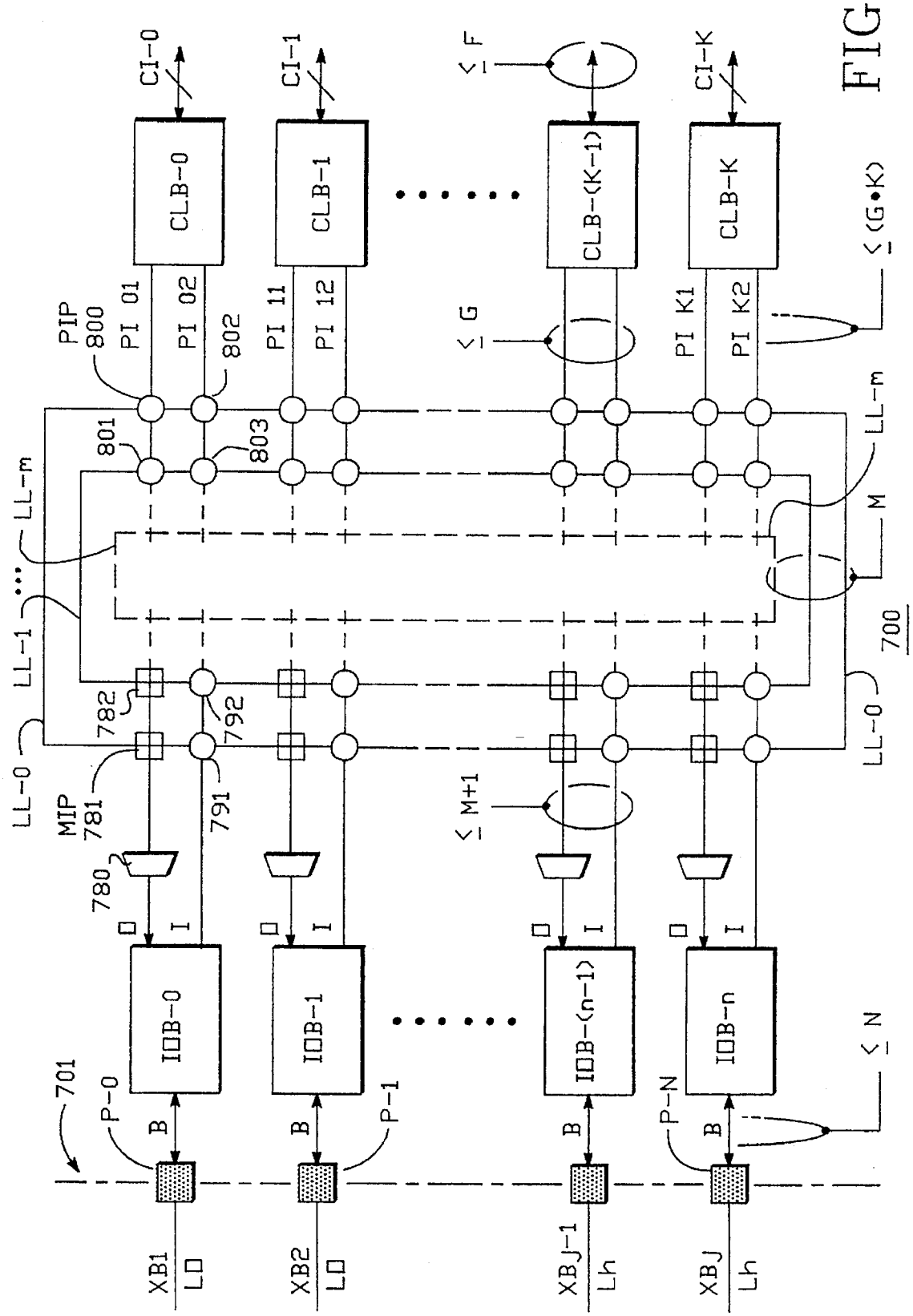
FIG. 7 diagrams a second chip-internal bus-multiplexing scheme in accordance with the invention.

FIG. 7 shows another, more generalized, embodiment of the invention. The embodiment 700 of FIG. 7 comprises a first plurality N=n+1 of IOB's (IOB-0 through IOB-n), a second plurality M=m+1 of longlines (LL-0 through LL-m)

and a third plurality K=k+1 of peripheral CLB's (CLB-0 through CLB-k) all provided on an integrated circuit chip.

Each CLB-i of CLB-0 through CLB-k has one or more peripheral interconnect lines, PI-i1 through PI-ig, extending across adjacent longlines LL-0 through LL-m. The peripheral interconnect lines, PI-i1 through PI-ig, are each programmably connectable to one or more of the intersecting longlines LL-0 through LL-m so that the corresponding CLB-i can communicate with others of the CLB's or with the IOB's by way of the one or more longlines, LL-0 through LL-m. A fourth plurality value, G=max(g), represents the maximum number of peripheral interconnect lines PI-i1 through PI-ig that may be found on any given one of CLB-0 through CLB-k. The maximum number of intersections between the M longlines and the K CLB's is M·(G·K).

Each CLB-i of CLB-0 through CLB-k further has one or more core interconnect lines, CI-i1 through CI-if, for communicating with the more interior, core portions of the FPGA device. A fifth plurality value, F=max(f), represents the maximum number of core interconnect lines CI-i1 through CI-if that may be found on any given one of CLB-0 through CLB-k.

Each IOB-i of IOB-0 through IOB-n of FIG. 7 has one outgoing-signal line (O) and one incoming-signal line (I) extending across longlines LL-0 through LL-m. The outgoing-signal lines (O), and incoming-signal lines (I), are each programmably connectable to one or more of the intersecting longlines LL-0 through LL-m so that the corresponding IOB-i can communicate with others of the IOB's or with the CLB's by way of the one or more longlines, LL-0 through LL-m.

Each IOB-i of FIG. 7 also has one bidirectional pin line (B) optionally connected to a corresponding input/output pad P-i. The IOB may be used for routing input or output signals of longlines LL-0 through LL-m either from one longline to another or between a longline and the corresponding input/output pad P-i. (The input/output pads of IOB-0 through IOB-n are respectively numbered as P-0 through P-n but there need not be an I/O pin for every IOB. Some IOB's can function as "buried" input/output cells rather than as externally accessible input/output cells.)

Dash-dot line 701 represents the chip boundary. XB1/L0 represents line-zero of a first chip-external bus, XB1. External bus line XB1/L0 connects through chip pad P-0 to the B (bidirectional) terminal of IOB-0. XB2/L0 represents line-zero of a second chip-external bus, XB2. External bus line XB2/L0 connects to the B terminal of IOB-1. XBj/Lh represents line-h of a jth chip-external bus, XBj, where j is two or greater and h is greater than zero. External bus line XBj/Lh connects to the B terminal of IOB-n. The number (j) of external buses XB1–XBj is an arbitrary plurality which is chosen in accordance with the dictates of the chip-external design (or put otherwise, in accordance with the unshown interconnections to be made to the left of chip-boundary line 701). The number (h) of lines $L_0$–$L_h$ in each of the chip-external buses XB1–XBj is also an arbitrary plurality which is chosen in accordance with the dictates of the chip-external design. As such, the total number (j·h) of external bus lines that enter the chip will vary depending on the number of lines selected per external bus XB and the number I/O pins (P-0 through P-n) provided along boundary 701 for connection to such external bus lines. Of course, it is not possible to have more external bus lines than the number of available I/O pins (P-0 through P-n). On the other hand, it is possible to have more available I/O pins (P-0 through P-n) than external bus lines.

The number N of IOB's provided within the FPGA device should be at least equal to the number of external interconnect pins that are to function as I/O pins for the CLB array. N can be greater, however, since not all IOB's necessarily connect directly to an I/O pin.

The number of IOB's that connect directly to an I/O pin (which number can be expressed as N'≦N) is preferably an integer multiple of 4 such as 8, 16 or 32 so that a plurality of nibble-wide buses (each four lines wide) or byte-wide buses (each eight lines wide) can simultaneously connect to such IOB's.

The M longlines (LL-0 through LL-m) are each coextensive with and programmably connectable to at least 2 of the N IOB's (IOB-0 through IOB-n) and to at least 2 of the K CLB's (CLB-0 through CLB-k).

The numbers N, M, K and G (which respectively define the number of IOB's, longlines, peripheral CLB's and CLB peripheral interconnect lines) can be selected to provide a variety of interconnect possibilities.

Programmable interconnect points (PIP's, represented by open circles such as 800 and 801 or 791 and 792) and user-programmable multiplexer input connections (MIP's such as represented by squares 781 and 782) are distributed along the M longlines, at selected intersections of the longlines (LL-0 through LL-m) with the N incoming-signal lines (I) and the N outgoing-signal lines (O) of the IOB's and the K or more peripheral interconnect lines (PI-01 through PI-kg) of the CLB's.

The CLB PIP's (800, 801, etc.) and the IOB PIP's (791, 792, etc.) and the IOB MIP's (781, 782, etc.) can be selectively placed along the M longlines so that the entirety, or any predefined subgroup, of the K CLB's can be programmably coupled to the entirety, or any predefined subgroup, of the N of IOB's.

As already explained, there are as many as M·(G·K) intersections of the M longlines with the peripheral interconnect lines of the K CLB's. If each such intersection were to be occupied by a PIP (hereafter CLB PIP), there would be as many as M·(G·K) CLB PIP's populating the design.

Each IOB has one I line and as many as M other lines extending from its UPM (e.g., 780) to intersect with the M longlines. If each such intersection were to be occupied by a PIP or MIP (hereafter IOB PIP or MIP), there would be as many as N·M IOB PIP's populating the design and as many as N·M$^2$ IOB MIP's populating the design.

In accordance with the invention, less than the full complement of PIP's and MIP's is provided at the intersections of the M longlines with the G·K lines from the CLBs and with the N·(M+1) lines from the IOB's. The PIP's and MIP's are dispersed among the intersections of the M longlines with the other lines such that each of the M longlines has substantially the same number of PIP's attached to that longline and substantially the same number of MIP's attached to that longline. This provides an essentially equal amount of capacitive loading on each of the M longlines. The signal propagation delay of the programmable interconnect that couples the K CLB's or a subset thereof to one or another of the external buses XB1–XBj is therefore essentially the same irrespective of which external bus XB1–XBj is selected.

As seen in FIG. 7, IOB-0 has a user-programmable multiplexer (UPM) 780 for programmably coupling a selected one (e.g., LL-0 by way of MIP 781) or more (e.g., LL-1 by way of MIP 782) of longlines LL-0 through LL-m to the outgoing-signal line (O) of IOB-0. A corresponding one or more PIP's 791, 792 are provided along the incoming-signal line (I) of IOB-0 for programmably coupling a selected one (e.g., LL-0) or another (e.g., LL-1) of longlines LL-0 through LL-m to the incoming-signal line (I) of IOB-0. Similar programmably-selected interconnect means (PIP's and MIP's) are provided for the other Input/Output Blocks (IOB-2 through IOB-n).

As further seen in FIG. 7, peripheral CLB-0 has a plurality of peripheral interconnect lines, such as PI-01 and PI-02, each of which lines is programmably connectable by PIP's provided along that line, such as PIP's 800 and 801, to a selected one (e.g., LL-0) or more (e.g., LL-1) of longlines LL-0 through LL-m. Peripheral CLB's 1 through k are similarly connectable by way of their peripheral interconnect lines and PIP's to corresponding ones of longlines LL-0 through LL-m.

If desired, the number of peripheral interconnect lines (PI-01, PI-02) per peripheral CLB can be increased beyond what is shown. In such a case the peripheral interconnect lines of CLB-0 would be denoted as PI-01 through PI-0g, the peripheral interconnect lines of CLB-1 would be denoted as PI-11 through PI-1g', and so forth; where g, g'≦G represent the number of peripheral interconnect lines per CLB. A symmetrical organization is preferred where pairs or more preferably all the CLB's have the same number g=g' of peripheral interconnect lines.

Ideally, one would like to have the option of being able to programmably connect any CLB to any IOB. Such an interconnect scheme would require a full crossbar. A full crossbar would have as many as $M \cdot (G \cdot K)$ CLB PIP's populating its design, as many as $N \cdot M$ IOB PIP's populating its design and as many as $N \cdot M^2$ IOB MIP's populating its design. Unfortunately, a serious problem would develop in the design of FIG. 7 if a full crossbar were used.

Each integrated circuit chip has a finite, limited space into which designers are forever trying to squeeze more and more functionality. PIP's and MIP's consume space both directly and through the various memory or other circuits that support their programmability. If one tried to provide full crossbar connectability between IOB's 0-n and CLB's 0-k, then either the values n and k would have to be severely limited or the size and functionality of the core logic (not shown) would have to be severely limited due to limited space on the chip.

Signal propagation delay is also a problem. As one or more of values, N, K or G is increased in a full crossbar design, there is a corresponding increase in the number of PIP's and/or MIP's that would have to be placed on each of longlines LL-0 through LL-m. This would disadvantageously increases the line capacitance and signal propagation delay time of each longline. Similarly, if the value M is scaled upwardly in a full crossbar design, there would be a corresponding increase in the number of PIP's/or MIP's that would have to be placed on each of the peripheral interconnect lines PI-01 through PI-kg and incoming-signal lines (I) and outgoing-signal lines (O). This would disadvantageously increases the line capacitance and signal propagation delay time of each such line. Device performance speed would suffer.

In accordance with one aspect of the invention, programmable interconnectability between each peripheral CLB and all the IOB's is limited to providing interconnectability between that CLB and a predefined subset of the IOB's over a predefined subset of longlines LL-0 through LL-m. PIP's and MIP's are not included at points where interconnectability is not to be provided. This limited form of connectivity is preferably distributed evenly over the available set of longlines LL-0 through LL-m so as to minimize the number of PIP's and MIP's attached to each of longlines LL-0 through LL-m and so as to thereby minimize line capacitance and signal propagation delay time along each longline.

In one embodiment of FIG. 7, where there are eight IOB's directly connected to 8 input/output pins (N'=8), sixteen peripheral longlines (M=16), and sixteen peripheral CLB's (K=16). Each CLB-i of CLB-0 through CLB-F has only one peripheral interconnect line PI-ig and connects to a corresponding one LL-i of longlines LL-0 through LL-F by way of a single PIP on the peripheral interconnect line PI-i of that CLB-i. The IOB PIP's and IOB MIP's on longlines LL-0 through LL-F (F is the hexadecimal symbol for decimal value 15 here) are limited such that each IOB is connectable to a unique CLB group consisting of eight CLB's. This architecture is referred to here as 700(NMKG=8, 16, 16, 1). The ratio of pins to peripheral CLB's is one to two.

The below Table-1 shows in matrix form, one example of a limited interconnection scheme of this type. The top row of Table-1 shows CLB numbers. The left column shows IOB numbers. Each vertical column represents a corresponding one of longlines LL-0 through LL-F. Each "Y" found in a vertical column of Table-1 represents a set composed of one IOB PIP and one IOB MIP. An additional PIP for coupling the peripheral interconnect line of each named CLB to its corresponding longline is also understood to be provided on the longline. Programmable interconnectivity is provided along each longline only between each respective IOB and/or CLB having a matrix box marked with a "Y" (Yes) in the column of that longline.

The hexadecimal notations of A,B,C,D,E and F are used to represent CLB's and longlines numbered 10 through 15. A study of the PIP's and MIP's that are provided about the longline structure of FIG. 7 to implement Table-1 would show that each longline (LL-0 through LL-F) has the same number of PIP's and MIP's (4 IOB PIP's, 4 IOB MIP's, and one CLB peripheral interconnect line PIP).

TABLE 1

| CLB:  | 0 | 1 | 2 | 3 | 4 | 5 | 6 | 7 | 8 | 9 | A | B | C | D | E | F |
|-------|---|---|---|---|---|---|---|---|---|---|---|---|---|---|---|---|
| IOB-0 | Y | Y | Y | Y | Y | Y | Y | Y |   |   |   |   |   |   |   |   |
| IOB-1 |   | Y | Y | Y | Y | Y | Y | Y | Y |   |   |   |   |   |   |   |
| IOB-2 |   |   | Y | Y | Y | Y | Y | Y | Y | Y |   |   |   |   |   |   |
| IOB-3 |   |   |   | Y | Y | Y | Y | Y | Y | Y | Y |   |   |   |   |   |
| IOB-4 |   |   |   |   | Y | Y | Y | Y | Y | Y | Y | Y |   |   |   |   |
| IOB-5 | Y | Y |   |   |   |   |   |   | Y | Y | Y | Y | Y |   |   |   |
| IOB-6 | Y | Y | Y |   |   |   |   |   |   |   |   | Y | Y | Y | Y |   |
| IOB-7 | Y | Y | Y | Y | Y |   |   |   |   |   |   |   |   |   | Y | Y |

A "Yes" (Y) mark in a given column of Table-1 does not mean that the respective CLB and IOB's are connected to one another, but rather that they can be connected to each other if a user wishes to so program the corresponding PIP's and MIP's. A blank box in a given column of Table-1 means that the user does not even have the option of interconnecting the respective IOB to the longline or CLB because there are no corresponding IOB PIP's and IOB MIP's for creating such a connection.

By way of example, suppose that an 8-bits wide parallel signal is to be input and/or output from CLB's 0, 2, 4, 8, A, C and E of architecture 700(NMKG=8, 16, 16, 1). This can be done in accordance with Table-1 by activating all the CLB peripheral interconnect line PIP's and further activating the programmable interconnections (IOB PIP's and MIP's) that are denoted by "Y" marks along a hypothetical line drawn from the top left "Y" of Table-1 to the "Y" of CLB-E and IOB-7.

Suppose that due to re-design, one wished to instead route the 8-bits wide parallel signal of IOB's 0–7 to respective CLB's 1, 3, 5, 9, B, D and F of architecture 700(NMKG=8, 16, 16, 1). This can be done in accordance with Table-1 by instead activating the programmable interconnections that are denoted by "Y" marks along a hypothetical line drawn from the top second "Y" of Table-1 to the "Y" of CLB-F and IOB-7. A bus-wide reroute of signals is thereby accomplished without any substantial change in signal propagation time.

In one specific embodiment of architecture 700(NMKG= 8, 16, 16, 1), each of CLB's 0, 2, 4, 8, A, C and E has the capability of outputting a signal representing a product term of as many as 15 core signals while each of CLB's 1, 3, 5, 9, B, D and F has the capability of outputting a signal representing a product term of as many as 20 core signals. One of the reasons that a reroute of the byte-wide signal might be required from original CLB's 0, 2, 4, 8, A, C and E to new CLB's 1, 3, 5, 9, B, D and F is because larger product terms are desired.

Table-1 provides roughly 66 different interconnect permutations. It is possible to not only shift the entirety of an 8-bits wide signal from one group of 8 CLB's to a different group of 8 CLB's IOB, but to also have two nibble-wide signals entering architecture 700(NMKG=8, 16, 16, 1) and to route each of the nibble-wide signals to a desired one of 4 groups of 4 CLB's each.

Note that the strategy employed in Table-1 is to shift a horizontal sequence of 8 "Y's" two boxes to the right as one steps down from the top row to lower rows. "Y's" that shift off the right side of Table-1 wrap around into the left side. Many other distribution patterns will of course become apparent to those skilled in the art. For example, the per row shift amount could be 4 boxes every row instead 2. The Y's could be spaced apart by one or more boxes in each row.

Also, the number of peripheral interconnect lines PI-ig per CLB could be increased above one or the connections between the CLB peripheral interconnect lines and the longlines could be made fixed (NIP) instead of programmable. If more than one peripheral interconnect line PI-ig is provided per CLB, one can add more peripheral longlines or distribute the CLB PIP's differently among the 16 longlines for each of the more than one peripheral interconnect lines PI-ig per CLB.

The general idea is to provide a uniform set of signal routing options between the IOB's and the CLB's satisfying the following design goals:

(1) Do not create a full crossbar;

(2) Distribute substantially the same numbers of PIP's and MIP's along each longline so that substantially equal delay will develop along each longline and it will make no difference from a timing standpoint, what CLB to IOB routes are activated;

(3) Minimize, as much as practical, the number of PIP's and MIP's provided along each longline so that capacitive loading on each longline is minimized and signal propagation delay along each longline is thereby also minimized; and (4) Provide a sufficient number of PIP's and MIP's to enable user programmable re-routing of bus-wide signals.

Figure 8A:
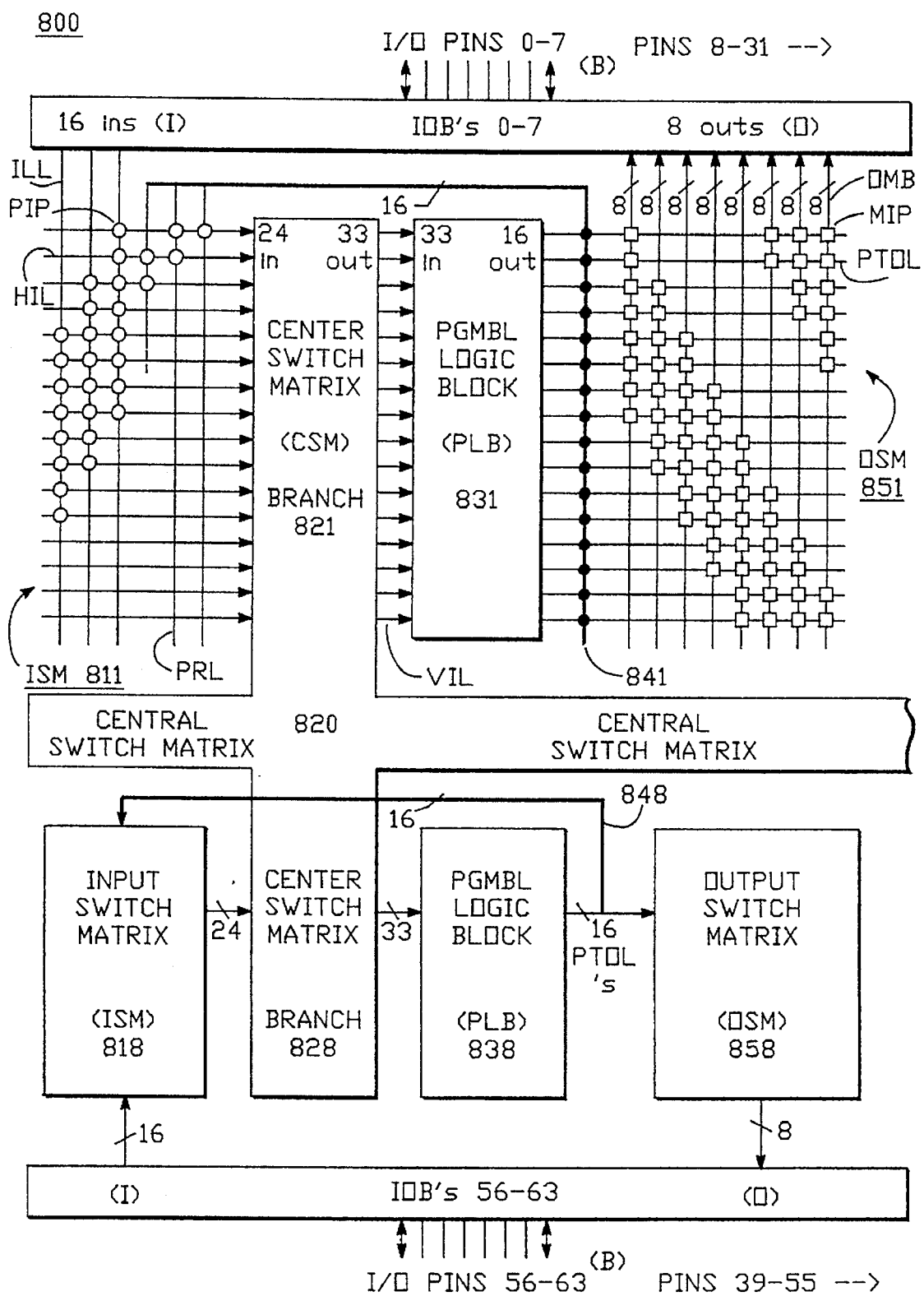
FIG. 8A shows a PAL-oriented implementation in accordance with the invention.

FIG. 8A shows a PAL-oriented, integrated circuit embodiment 800 of the invention known as the MACH4™ (AMD Macro Array CMOS High-density) device. A key feature in this device 800 is that it includes a plurality of programmable logic blocks (PLB's) and a plurality of programmable signal-routing modules (ISM, OSM, CSM) for programmably routing signals between the logic blocks with each programmable signal-routing module (ISM, OSM, CSM) being organized to provide a consistent, same signal delay time irrespective of the specific signal routing paths that the programmable signal-routing module has been programmed to provide.

The PLB's of FIG. 8A are collectively referenced as 830 and individually as 831, 832, . . . , 838. There is a total of eight PLB's in the MACH device 800 of FIG. 8A, each of substantially the same structure. Only a left end of the MACH device 800 is shown with PLB's 831 and 838. (See FIG. 8C for a block diagram overview.)

Each individual PLB 831, 832, . . . , 838, has approximately 33 variable input lines (VIL's) and 16 product term output lines (PTOL's).

Like earlier programmable array logic (PAL) devices, the MACH4™ device 800 includes within each of its PLB's 831–838, a product-term means (not shown) for generating a sum of product-terms output on each product term output line (PTOL) of the form: $(I_1 \cdot I_2 \cdot I_3 \cdot \ldots) + (I_4 \cdot I_5 \cdot I_6 \cdot \ldots) + (I_7 \cdot I_8 \cdot I_9 \cdot \ldots) + \ldots$, where $I_j$ represents an input binary variable, the bullet symbol "·" represents a logic AND operation and the plus symbol "+" represents a logic OR operation. Details regarding the internal structures of specific embodiments of the PLB's may be found in the above cited U.S. Pat. Nos., 5,015,884 and 5,151,623. Preferably, signal propagation time through the PLB should be substantially the same irrespective of the programmably-selected transfer function or functions that define signals on the product term output lines (PTOL's) of the PLB as functions of the signals applied to the variable input lines (VIL's) of the PLB.

There are a total of sixty-four input/output pins numbered as PIN-0 through PIN-63. Although only the left end of the MACH device 800 is shown in FIG. 8A, it is understood that the remainder of the device 800 continues with the same structure being repeated three more times to the right. (See FIG. 8C.) The central switching matrix (CSM) 820 forms a continuous backbone of the device 800. Remaining pins 8–31 and PLB's 832–834 are organized above this backbone while remaining pins 39–55 and PLB's 835–837 are organized below the backbone in symmetrical opposition.

The 64 I/O pins are subdivided into clusters of eight pins, with each pin cluster being allocated to a respective one of programmable logic blocks 831 through 838. Each I/O pin has a correspondingly numbered Input/Output Block (IOB-0 through IOB-63).

Figure 8B:
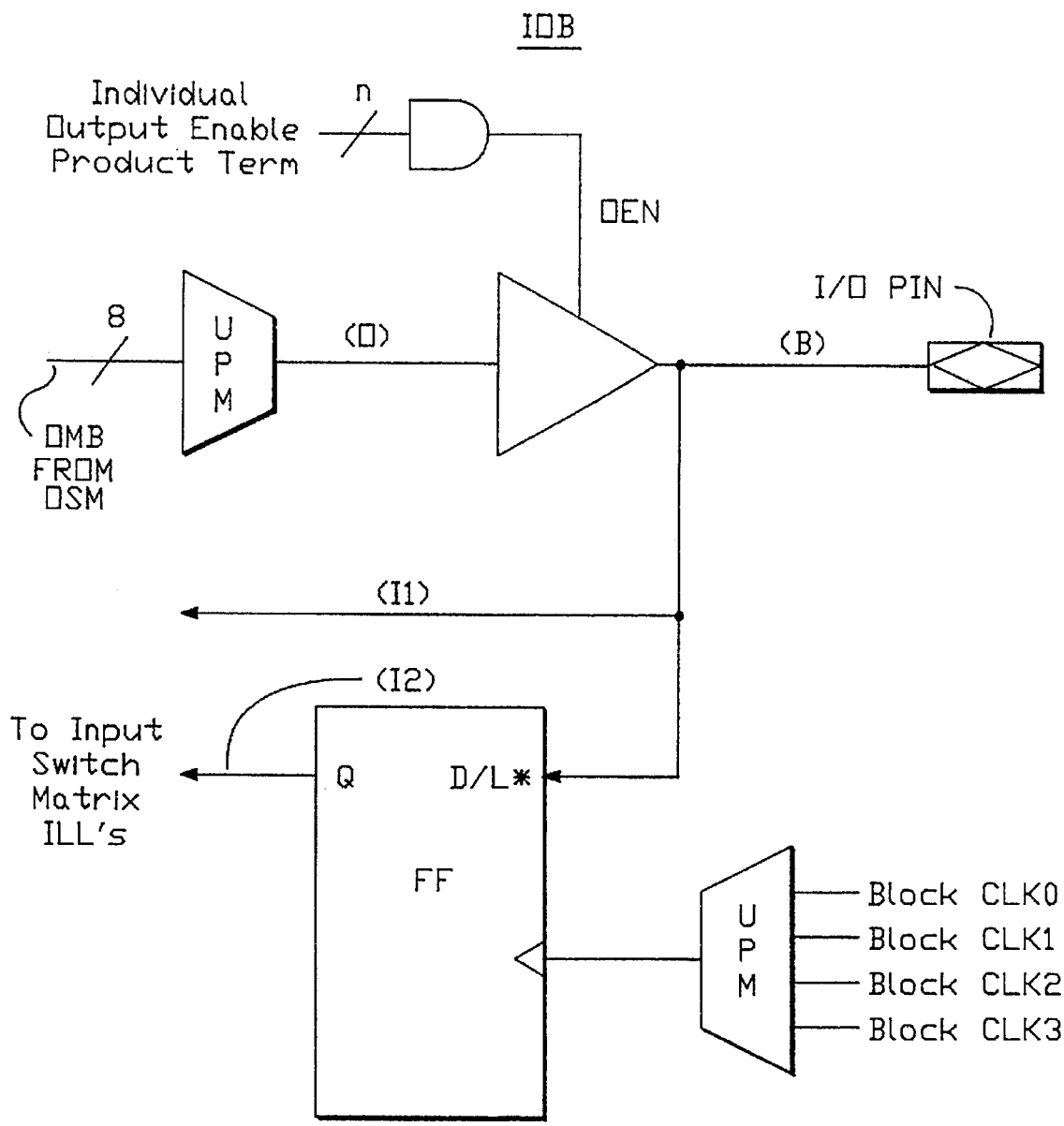
FIG. 8B shows an IOB cell for use in the implementations of FIGS. 8A and 8C.
Figure 8C:
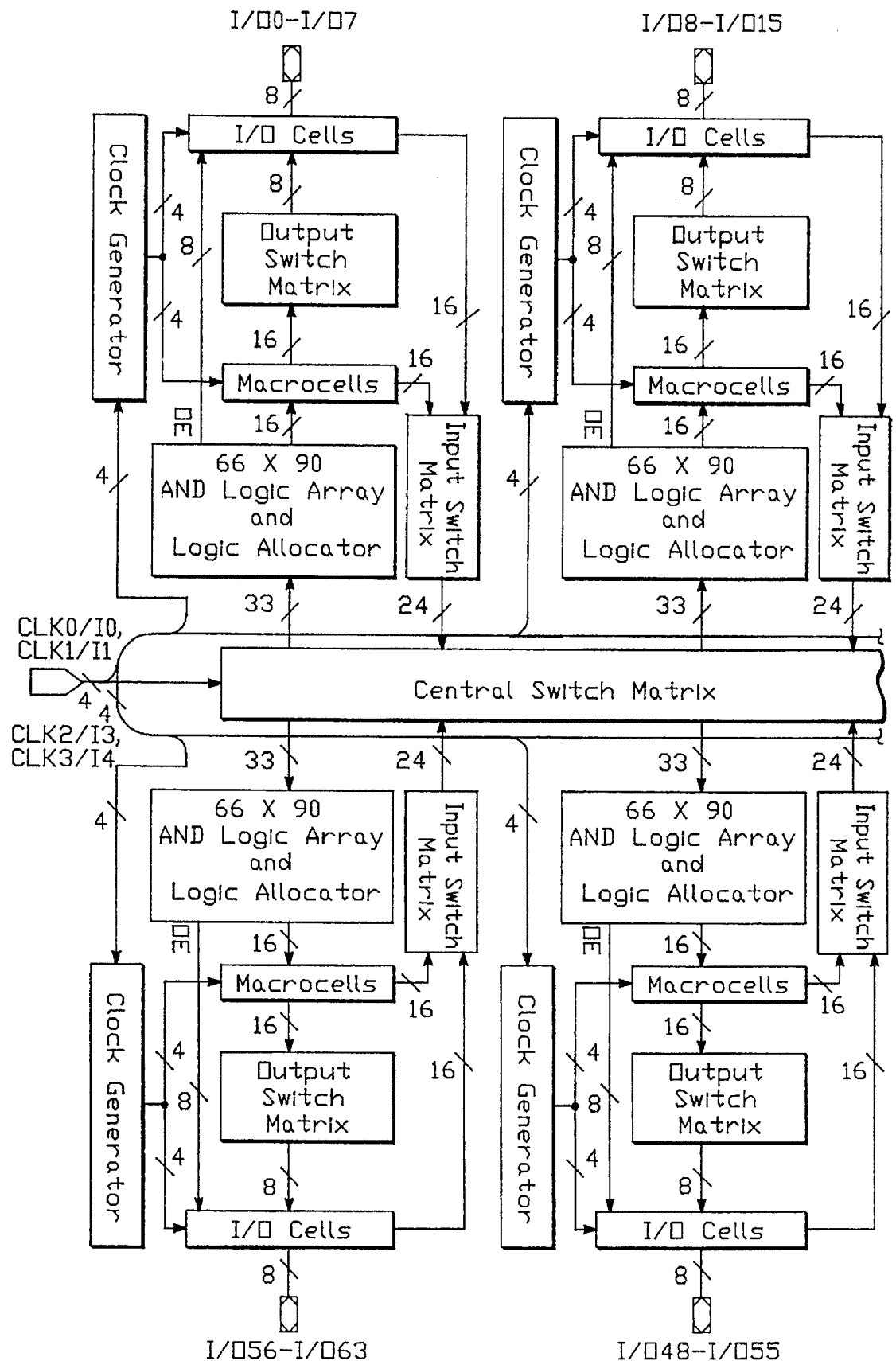
FIG. 8C shows a detailed implementation in accordance with FIGS. 8A and 8B.

Referring briefly to FIG. 8B, each IOB has a bidirectional (B) terminal connected to its corresponding I/O pin, a signal output terminal (O) for carrying signals out of the MACH4 integrated circuit device 800 by way of a tri-statable driver, and two signal input terminals (I2=registered and I1=nonregistered) for respectively carrying a registered signal and a nonregistered signal into the MACH4 integrated circuit device 800.

The right side of FIG. 8A shows eight output multiplexer buses (OMB's) rising vertically into the O terminals of respective IOB's 0-7. Each output multiplexer bus (OMB) consists of 8 output longlines. Due to space constraints, squares without the trapezoidal multiplexer symbol of FIG. 2B are used to represent the user-programmable multiplexers (UPM's) that route signals into the O terminals of the IOB's. (These UPM's are shown in FIG. 8B.)

Although not fully shown on the left side of FIG. 8A, it is to be understood that sixteen input longlines (ILL's) descend vertically from the registered and nonregistered I terminals of respective IOB's 0-7.

A first branch 821 of the central switching matrix (CSM) 820 is interposed between the sixteen input longlines (ILL's) and PLB 831. Central switch branch 821 receives 24 input signals over a horizontally extending set of 24 horizontal input lines (HIL's) and outputs 33 variable input signals over a horizontally extending set of 33 variable input lines (VIL's). The 33 VIL's extend into the corresponding programmable logic block (PLB) 831.

A product return bus 841 collects the 16 output signals of PLB 831 and feeds them back over 16 vertically descending, product-return lines (PRL's) interposed between the 16 input longlines (ILL's) and the central switch branch 821. Due to space limitations, only a few of these product-return lines (PRL's) are shown in FIG. 8A.

An input switch matrix (ISM) 811 is formed by providing PIP's (programmable input points) at selected intersections of the 24 horizontal input lines (HIL's) and the 16 vertical input longlines (ILL's) plus the 16 vertical product-return lines (PRL's).

An output switch matrix (OSM) 851 is formed by providing MIP's (user-selectable multiplexer input points) at selected intersections of the 16 horizontal product term output lines (PTOL's) and the 8 vertical output multiplexer buses (OMB's).

Due to space constraints, details regarding placement of MIP's or PIP's is shown only within the drawing of OSM 851. MIP's are placed within OSM 851 in vertical clusters of 8 MIP's each along each OMB, as seen, in conformance with above Table-1. The O terminal of each of IOB's 0-7 therefore can be programmably connected to one of a corresponding cluster of eight product term output lines (PTOL's) exiting from PLB 831. The positioning of each MIP cluster is shifted down by two places, with wrap around, as one moves from left to right across the OMB's of OSM 851. Thus, all 16 product term output lines (PTOL's) of PLB 831 can be programmably coupled to I/O pins 0-7, with each of I/O pins 0-7 being programmably floatable across 8 of the 16 PTOL's.

Although not fully shown, PIP's are similarly positioned as clusters of 8 along the input longlines (ILL's) of the input switch matrix (ISM) 811 with a shift of two places down as one moves horizontally across the ISM 811. Thus, all 24 horizontal input lines (HIL's) of central switch branch 821 can be programmably coupled to I/O pins 0-7, with each of I/O pins 0-7 being programmably floatable across 8 of the 24 HIL's.

In addition to having PIP's for programmably "floating" an optional connection from each I/O pin across a cluster of 8 HIL's, the input switch matrix (ISM) 811 includes additional PIP's for programmably "floating" an optional connection from one of two product term output lines (PTOL's) to each HIL. HIL-0 is optionally connectable to PTOL-0 or PTOL-1. HIL-1 is optionally connectable to PTOL-1 or PTOL-2. HIL-2 is optionally connectable to PTOL-2 or PTOL-3. And so forth, with wrap around.

In the input switch matrix (ISM) 811, a same number of PIP's is found along each horizontal input line (HIL) so that each HIL exhibits a same signal propagation delay. A same number of PIP's is found along each input longline (ILL's) so that each ILL exhibits a same signal propagation delay. A same number of PIP's is found along each product-return line (PRL) so that each PRL exhibits a same signal propagation delay. Thus signal propagation delay is the same from any of I/O pins 0-7, through the ISM 811, to a selected HIL irrespective of which I/O pin and HIL is chosen. Signal propagation delay is the same from any of product term output lines (PTOL's) of PLB 831, through the ISM 811, to a selected HIL irrespective of which PTOL and HIL is chosen.

In the output switch matrix (OSM) 851, a same number of MIP's is found along each horizontal product term output line (PTOL) so that each PTOL exhibits a same signal propagation delay. A same number of MIP's is found along each vertical output multiplexer bus (OMB) so that each OMB exhibits a same signal propagation delay. Thus signal propagation delay is the same from any of the 16 product term output lines (PTOL's), through the OSM 851, to a selected one of I/O pins 0-7 irrespective of which I/O pin and PTOL is chosen.

It is to be understood, although not shown, that similar structuring is provided for the other I/O pin clusters: 8-15, 16-23, 24-31, 31-39, 40-47, 48-55 and 56-63; as well as the corresponding ISM's 812-818, central switch branches 822-828, PLB's 832-838, and OSM's 852-858.

It is to be further understood that although the PIP's and MIP's are dispersed in similar manners among the line intersections of the input switch matrix (ISM) 811 and output switch matrix (OSM) 851, that other distributions of these interconnect means are possible among the intersection points of the ISM 811 and OSM 851. The patterns of available input and output connection routes do not have to be symmetrical.

Signal flow from an off-chip signal source into the MACH4 device 800 is as follows. The externally-sourced signal enters one of the 64 I/O pins. It generally doesn't matter which one. The externally-sourced signal travels through the corresponding IOB, out of the registered or nonregistered output of the IOB and along the corresponding input longline (ILL). An activated one or more PIP's guides the externally-sourced signal from the ILL to a respective one or more horizontal input lines (HIL's).

The central switching matrix (CSM) 820 is organized to provided cross connections between HIL's and VIL's in a less than full crossbar fashion similar to that discussed for the longlines LL-0 through LL-m of FIG. 7. Signal propagation delay from any HIL of any branch 821-828 to any cross-connectable variable input line (VIL) of any same or other branch 821-828 is the same irrespective of the chosen route. Thus, an externally-sourced signal can be routed with the same signal propagation delay time from any I/O pin to almost any variable input line (VIL) of almost any programmable logic block (PLB) 831-838. Signal propagation time through each PLB is the same irrespective of how product terms and sums are allocated within the PLB.

A detailed description of an embodiment of the central switching matrix (CSM) 820 may be found in the above-cited and co-pending application Ser. No. 07/924,685 filed Aug. 3, 1992. As such only a brief overview is provided here. A total of 8×24=192 lines enter the central switching matrix (CSM) 820 by way of the input switch matrices (ISM's) 811–818. In addition there are 6 to 18 direct connection lines (not shown) from I/O pins to the input-side of the central switching matrix (CSM) 820.

Assume there are 6 such direct connection lines for sake of example. (See FIG. 8C.) That makes a total of 198 input lines entering the CSM 820. The 198 lines cross with the 33 variable input lines (VIL's) of each of the programmable logic blocks (PLB's) 831–838 to provide 198×33=6,534 intersection points per PLB. These 6,534 intersection points are not fully populated with PIP's however. That would consume excessive die space and introduce excessive capacitive loading on the input and output lines of the CSM 820. Instead a set of 594 PIP's are judiciously distributed across the 6,534 central-matrix intersection points associated with each PLB to provide a consistent signal propagation time from any given one of the 198 input lines entering the CSM 820 to programmably-connectable ones of the 33 variable input lines (VIL's) entering each PLB. The number 594 has integer factors of 33 and 18. (594=33×18.) As such each of the 33 variable input lines (VIL's) entering each PLB is provided with a same number of 18 PIP's along its length to assure equal loading on each VIL. And each of the 33 variable input lines (VIL's) can accordingly receive a signal from a subset of 18 of the 198 input lines entering the CSM 820.

The 594 PIP's are further positioned to create a pattern which also places an equal number of PIP's along the length of each of the 198 input lines entering the CSM 820. In the given example that works out to 3 PIP's along each of the 198 input lines. (198×3=594.) Thus, signal propagation time through the central switching matrix (CSM) 820 is the same irrespective of the routing chosen from any given CSM input line to a programmably-connectable CSM output line (the latter of which becomes a variable input line, VIL).

As noted above, signal propagation time through each PLB is preferably the same irrespective of the programmably-selected transfer function or functions that define signals on the product term output lines (PTOL's) of the PLB as functions of the signals applied to the variable input lines (VIL's) of the PLB.

The product term signals output from each PTOL (product term output line) of each of PLB 831–838 can be routed by way of the local output switch matrix (OSM) 851–858 to any one of 4 I/O pins in the adjoining pin cluster (0–7, 8–15, 16–23, 24–31, 31–39, 40–47, 48–55 and 56–63). Additionally or alternatively, the product term signals output from each PTOL of each of PLB 831–838 can be routed by way of the local output switch matrix (OSM) 851–858 to one or more of the horizontal input lines (HIL's) of the local branch 821–828 of the central switching matrix (CSM) 820.

This arrangement provides substantial flexibility for the placement of logic functions among PLB's 831–838 and the routing of externally-sourced signals to the PLB's 831–838 and the routing of formed sum-of-products signals from the PLB's 831–838 to desired I/O pins. Regardless of whether the place and route operations are performed manually or by software, concern for variances in signal propagation time due to routing is removed because all routed have essentially the same signal propagation time.

Accordingly, the board level re-design problem 23 of FIG. 1 is often times easily solved when user-programmable integrated circuits (UPD's) of the type described for FIGS. 2–8 are used. I/O pinouts can be programmably "floated" to match many different board-level pinout-patterns without having to re-design most of the internal logic of the UPD. The design of UPD internal logic can proceed without having to worry that bus re-routes may later occur at the board level.

The above disclosure is to be taken as illustrative of the invention, not as limiting its scope or spirit. Numerous modifications and variations will become apparent to those skilled in the art after studying the above disclosure. In summary, a method and on-chip architecture have been disclosed for multiplexing signals from selected external interconnect buses to chip internal buses such that bus rerouting can be implemented programmably without substantially affecting timing relations between time-parallel signals of a rerouted bus. An on-chip switch matrix is provided having N input lines crossing with M output lines to provide N times M crosspoints. A plurality of substantially less than N times M programmable interconnect switches (PIP's) are distributed symmetrically among the N·M crosspoints such that a same first number of interconnect switches (PIP's) are found along each of the N input lines thereby providing equal loading on each input line. The plurality of programmable interconnect switches (PIP's) are further distributed among the N·M crosspoints such that a same second number of interconnect switches (PIP's) are found along each of the M output lines thereby providing equal loading on each output line.

Given the above disclosure of general concepts and specific embodiments, the scope of protection sought is to be defined by the claims appended hereto.

What is claimed is:

1. A user-programmable device comprising:

(a) a monolithic substrate having logic and interconnect circuitry provided thereon;

(b) a first plurality of first through Nth Input/Output Blocks (IOB's) provided on the substrate for receiving output signals of the substrate interconnect circuitry and coupling the output signals to points outside the substrate, and for receiving input signals from points outside the substrate and supplying the received input signals to the substrate interconnect circuitry;

(c) where the substrate interconnect circuitry includes at least one longline bus extending over or next to the first plurality of IOB's, the at least one longline bus having first through Mth longlines, each extending over or next to the first plurality of IOB's;

(d) where the Substrate interconnect circuitry further includes bus multiplexing means for selectively coupling respective ones of the first plurality of N IOB's bidirectionally to preselected ones of the first through Mth longlines of the at least one longline bus, the bus multiplexing means providing selective bidirectional coupling between at least one of the longlines in the at least one longline bus and a programmably selected one or the other of two IOB's among said first plurality of IOB's such that signal propagation delay between the at least one longline and the programmably selected one or another of said two IOB's is substantially the same irrespective of which of the two IOB's is selected; and (e) where said logic includes a first plurality of first through Kth logic blocks (CLB's) operatively coupled to respective ones of the first through Mth longlines of the at least one longline bus.

2. The user-programmable device of claim 1 wherein (d.1) the bus multiplexing means has a limited connectivity function such that, with respect to programmably-routable connections between CLB's and IOB's and for i equal to 0 through k, each CLB-i of the first through kth logic blocks (CLB's) is programmably connectable to only a cluster of IOB's, the cluster consisting of two or more but less than all of said first plurality of N IOB's.

3. The user-programmable device of claim 2 wherein the number of IOB's in a cluster is equal to or less than N/2.

4. The user-programmable device of claim 1 wherein the number of longlines, M is at least four.

5. The user-programmable device of claim 4 wherein M is at least eight.

6. The user-programmable device of claim 4 wherein the number of CLB's, K is at least four.

7. The user-programmable device of claim 1 wherein the number of IOB's, N is at least four.

8. The user-programmable device of claim 7 wherein N is at least eight.

9. A user-programmable device according to claim 1 wherein:

(c.1) the substrate interconnect circuitry further includes a second longline bus extending by the first plurality of IOB's, the second longline bus having respective first through Mth longlines, each extending by the first plurality of IOB's;

(d.1) said bus multiplexing means is further for selectively coupling respective ones of the first plurality of N IOB's to preselected ones of the respective first through Mth longlines of the second longline bus, the bus multiplexing means providing selective coupling between at least one of the respective longlines in the second longline bus and a programmably selected one or the other of said two IOB's among said first plurality of IOB's such that signal propagation delay between the respective at least one longline of the second longline bus and the programmably selected one or the other of the two IOB's is substantially the same irrespective of which of the two IOB's is selected, and further such that signal propagation delay is substantially the same between the selected one of the two IOB's and either of the selectively coupled longlines in the respective one and second longline buses irrespective of whether such selective coupling is established between the selected IOB and one or the other or both of the two longline buses.

10. A user-programmable device according to claim 9 wherein:

(e.1) said first plurality of first through Kth logic blocks (CLB's) is further operatively coupled to respective ones of the first through Mth longlines of the second longline bus in a manner similar to the coupling of the first plurality of logic blocks to corresponding ones of the first through Mth longlines of the one longline bus such that a plurality of K or fewer signals may be transferred with a substantially same time delay between a corresponding K or fewer of the first plurality of logic blocks and either of the one and second longline buses.

11. The user-programmable device of claim 10 wherein the number of longlines, M in each of the one and second longline buses is equal to at least four.

12. The user-programmable device of claim 11 wherein the number N, of IOB's in said first plurality of IOB's is at least eight.

13. The user-programmable device of claim 10 wherein the first plurality of N IOB's and the first plurality of K logic blocks are symmetrically couplable to the one and second longline buses such that said plurality of K or fewer signals may be transferred with a substantially same time delay between the corresponding K or fewer of the first plurality of logic blocks and a subset of K or fewer of the first plurality of N IOB's over a corresponding one or the other of the one and second longline buses.

14. The user-programmable device of claim 13 wherein the first plurality of N IOB's and the first plurality of K logic blocks are symmetrically couplable to the one and second longline buses such that said plurality of K or fewer signals may be transferred with said substantially same time delay between the corresponding K or fewer of the first plurality of logic blocks and the subset of K or fewer of the first plurality of N IOB's over either of the one and second longline buses.

15. A user-programmable device according to claim 1 wherein:

(d.1) said bus multiplexing means provides evenly-distributed but partially-populated, selective cross-bar coupling between said first plurality of N IOB's and said first plurality of M longlines.

16. A user-programmable device according to claim 15 wherein:

(d.2) said bus multiplexing means further provides evenly-distributed but partially-populated cross-bar coupling between said first plurality of K CLB's and said first plurality of M longlines.

17. A user-programmable device according to claim 1 wherein:

(c.1) capacitive loading on each of said first through Mth longlines is essentially the same.

18. A user-programmable device according to claim 1 further comprising:

(f) a second plurality of first through Nth Input/Output Blocks (IOB's) provided on the substrate for receiving further output signals of the substrate interconnect circuitry and coupling the further output signals to points outside the substrate, or for receiving further input signals from points outside the substrate and supplying the received further input signals to the substrate interconnect circuitry;

(g) where the substrate interconnect circuitry includes a second longline bus extending by the second plurality of IOB's, the second longline bus having first through Mth further longlines, each extending by the second plurality of IOB's;

(h) where the substrate interconnect circuitry additionally includes second bus multiplexing means for selectively coupling respective ones of the second plurality of N IOB's to preselected ones of the first through Mth further longlines of the second longline bus, the second bus multiplexing means providing selective coupling between at least one of the longlines in the second longline bus and a programmably selected one or another of two further IOB's among said second plurality of IOB's such that signal propagation delay between the at least one further longline and the programmably selected one or the other of said two further IOB's is substantially the same irrespective of which of the two further IOB's is selected.

19. A user-programmable device according to claim 18 wherein said logic further includes:

(i) a second plurality of first through Kth logic blocks (CLB's) operatively coupled to respective ones of the first through Mth longlines of the second longline bus.

20. A user-programmable device according to claim 1 wherein each of said K logic blocs is a programmably-configurable logic block.

21. A user-configurable switch matrix for use in a user-configurable logic device; said switch matrix comprising:
- a first plurality of N substantially parallel, first lines, where N is a number equal to or greater than four;
- a second plurality of M substantially parallel, second lines intersecting with the plurality of N first lines to form N·M intersection points, where M is a number equal to or greater than four; and
- a third plurality of J, user-programmable interconnect means dispersed among the N·M intersection points, where J is a number equal to or greater than eight but less than N·M;
- wherein each user-programmable interconnect means is programmable for either creating a connection between the intersecting lines of its intersection point or leaving an open circuit between the intersecting lines at its intersection point; and
- wherein the J user-programmable interconnect means are dispersed among the N·M intersection points such that each first line of the first plurality of N lines has a substantially same number of user-programmable interconnect means dispersed along the length of that first line so that each of the N first lines has a substantially same signal propagation delay.

22. A user-configurable switch matrix according to claim 21
wherein the J user-programmable interconnect means are dispersed among the N·M intersection points such that each second line of the second plurality of M lines has a substantially same number of user-programmable interconnect means dispersed along the length of that second line so that each of the M second lines has a substantially same signal propagation delay.

23. A user-configurable switch matrix according to claim 22
wherein the user-configurable logic device has a plurality of N input/output pins respectively and operatively coupled to the N first lines such that an externally-sourced signal applied to a given one of said input/output pins can be routed from the given pin through the corresponding first line and through one or more of the user-programmable interconnect means to a respective one or more of the second lines with a substantially same signal propagation delay time irrespective of which one or more of the second lines is chosen as a destination for the routed signal.

24. A user-configurable switch matrix according to claim 22 wherein the user-configurable logic device includes:
- a plurality of N/2 input/output blocks each having a bidirectional I/O terminal, a signal outputting terminal and two signal inputting terminals, the two signal inputting terminals of the N/2 input/output blocks being respectively coupled to the N first lines;
- a plurality of N/2 input/output pins respectively and operatively coupled to the bidirectional I/O terminals of the N/2 input/output blocks such that an externally-sourced signal applied to a given one of said input/output pins can be routed from the given pin through the corresponding input/output block, through the corresponding first line and through one or more of the user-programmable interconnect means to a respective one or more of the second lines with a substantially same signal propagation delay time irrespective of which one or more of the second lines is chosen as a destination for the routed signal.

25. A user-configurable switch matrix according to claim 22
wherein the user-configurable logic device includes a user-programmable logic block operatively coupled to receive input signals from two or more of the second lines.

26. A user-configurable logic device comprising:
- an input switch matrix;
- a user-programmable logic block operatively coupled to receive input signals from the input switch matrix, the user-programmable logic block having a plurality of M' result output lines for outputting result signals formed by logic operations performed on the input signals received from the input switch matrix, where M' is a number equal to or greater than four;
- an output switch matrix formed by a plurality of N' substantially parallel, output buses intersecting with the M' result output lines, where N' is a number equal to or greater than four, where each output bus has a plurality of N" substantially parallel output lines, where N" is a number equal to or greater than four, and where each output bus has associated therewith a bus access node to which a signal from a selected output line of the bus is to be supplied;
- the output switch matrix further including a plurality of J', user-programmable interconnect means dispersed among N'·M'·N" intersection points formed by the intersections of the M' result output lines with the N'·N" output lines of the output buses, where J' is a number equal to or greater than eight but less than N'·M'·N";
- wherein each user-programmable interconnect means is programmable for either creating a connection between the intersecting result output line of its intersection point and the associated bus access node or leaving an open circuit between the intersecting result output line at its intersection point and the associated bus access node; and
- wherein the J' user-programmable interconnect means are dispersed among the N'·M'·N" intersection points such that each result output line of the plurality of M' result output lines has a substantially same number of user-programmable interconnect means dispersed along the length of that result output line so that each of the M' result output lines has a substantially same signal propagation delay.

27. A user-configurable logic device according to claim 26
wherein the user-configurable logic device has a plurality of N' input/output pins respectively and operatively coupled to the N' bus access nodes of the output switch matrix such that an internally-sourced signal generated on a given one of M' result output lines can be routed to a desired one or more of the N' input/output pins through one or more of the user-programmable interconnect means and a respective one or more of the output lines of the N' output buses with a substantially same signal propagation delay time irrespective of which one or more of the N' input/output pins is chosen as a destination for the routed result signal.

28. A user-configurable logic device comprising:
- a package;
- a first number of I/O leads extending through the package for carrying signals between points inside and outside the package, said first number of I/O leads being partitionable at a given instant into a first subset of input leads and a second subset of output leads;

logic means within the package for executing pre-defined logic operations, the user-configurable logic means having a second number of logic input terminals for receiving logic input signals and a third number of logic output terminals for outputting logic output signals responsive to the logic input signals, said pre-defined logic operations defining a relation between the logic input and output signals, wherein the sum of the second and third numbers is greater than the first number; and user-configurable signal routing means within the package for programmably routing signals between the I/O leads and user-defined, corresponding ones of the logic input terminals and the logic output terminals, and through such routing, programmably partitioning the first number of I/O leads into said first subset of input leads and said second subset of output leads;

wherein the user-configurable signal routing means includes consistent-routing delay means for maintaining substantially same signal propagation delays for all logic input signals as measured from the user-defined first subset of input leads to corresponding ones of the logic input terminals irrespective of the input signal routing configuration selected by the user, and for maintaining substantially same signal propagation delays for all logic output signals as measured between the user-defined second subset of output leads and corresponding ones of the logic output terminals irrespective of the output signal routing configuration selected by the user.

29. A user-configurable logic device according to claim 28 wherein the logic means includes consistent logic-delay means for maintaining substantially same signal propagation delays through the logic means for all logic input and output signals as measured from the logic input terminals to the logic output terminals, irrespective of the logic operations performed by the logic means.

30. A user-configurable logic device according to claim 29 wherein the logic means includes a plurality of user-configurable logic blocks each for executing user-defined logic operations.

31. A user-configurable logic device comprising:

a package;

a first number of I/O leads extending through the package for carrying signals between points inside and outside the package, said first number of I/O leads being partitionable at a given instant in time into a first subset of input leads and a second subset of output leads;

user-configurable logic means within the package for executing user-defined logic operations, the user-configurable logic means having a second number of logic input terminals for receiving logic input signals and a third number of logic output terminals for outputting logic output signals responsive to the logic input signals, said user-defined logic operations defining a relation between the logic input and output signals, wherein the sum of the second and third numbers is greater than the first number, and wherein the third number is greater than the maximum number of I/O leads that can serve at a given instant as said second subset of output leads; and user-configurable output-signal routing means within the package for routing logic output signals from a user-defined subset of the logic output terminals to a corresponding, user-defined subset of the I/O leads, said user-defined subset of the I/O leads serving as the second subset of output leads;

wherein the user-configurable output-signal routing means includes consistent output-delay maintenance means for maintaining substantially same signal propagation delays for all logic output signals as measured between the user-defined second subset of output leads and corresponding ones of the logic output terminals irrespective of the output signal routing configuration selected by the user.

32. A user-configurable logic device according to claim 31 wherein the user-configurable output-signal routing means includes means for programmably routing the logic output signal of each logic output terminal to a programmably selectable one or more of a predefined cluster of the I/O leads, said predefined cluster of I/O leads defining an output cluster of I/O leads having a number of I/O leads that is smaller than the first number.

33. A user-configurable logic device according to claim 32 wherein the respective output clusters of logic output terminals distribute uniformly across substantially the full set of available I/O leads of said package.

34. A user-configurable logic device according to claim 33 wherein the number of I/O leads in each output cluster is less than or equal to one-half the first number.

35. A user-configurable logic device according to claim 32 wherein the number of I/O leads in each output cluster is less than or equal to one-half the first number.

36. A user-configurable logic device comprising:

a package;

a first number of I/O leads extending through the package for carrying signals between points inside and outside the package, said first number of I/O leads being partitionable at a given instant in time into a first subset of input leads and a second subset of output leads;

user-configurable logic means within the package for executing user-defined logic operations, the user-configurable logic means having a second number of logic input terminals for receiving logic input signals and a third number of logic output terminals for outputting logic output signals responsive to the logic input signals, said user-defined logic operations defining a relation between the logic input and output signals, wherein the sum of the second and third numbers is greater than the first number, and wherein the second number is greater than the maximum number of I/O leads that are available to serve at a given instant as said first subset of input leads; and user-configurable input-signal routing means within the package for routing logic input signals from a user-defined subset of the I/O leads to a corresponding, user-defined subset of the logic input terminals, said user-defined subset of the I/O leads serving as the first subset of input leads;

wherein the user-configurable input-signal routing means includes consistent input-delay maintenance means for maintaining substantially same signal propagation delays for all logic input signals as measured between the user-defined first subset of input leads and corresponding ones of the logic input terminals irrespective of the input signal routing configuration selected by the user.

37. A user-configurable logic device according to claim 36 wherein the user-configurable input-signal routing means includes means for programmably routing the logic input signal of each I/O lead that serves as an input lead to a programmably selectable one or more of a predefined cluster of the logic input terminals, said predefined cluster of logic input terminals defining an input cluster of logic input terminals having a number of logic input terminals that is smaller than the first number.

38. A user-configurable logic device according to claim 37 wherein the respective input clusters of logic input terminals distribute uniformly across substantially the full set of available I/O leads of said package.

39. A user-configurable logic device according to claim 38 wherein the number of logic input terminals in each input cluster is less than or equal to one-half the second number.

40. A user-configurable logic device according to claim 37 wherein the number of logic input terminals in each input cluster is less than or equal to one-half the second number.

41. A user-configurable logic device according to claim 40 wherein the user-configurable logic means includes a plurality of substantially identical user-configurable logic blocks each for executing user-defined logic operations;

wherein said second number of logic input terminals are uniformly subdivided among the plurality of substantially identical user-configurable logic blocks; and wherein the number of logic input terminals of each input cluster that connects to a given I/O lead constitute less than one-half the number of logic input terminals entering a corresponding logic block.

42. A user-configurable logic device according to claim 37 wherein the user-configurable logic means includes a plurality of substantially identical user-configurable logic blocks each for executing user-defined logic operations; and wherein said second number of logic input terminals are uniformly subdivided among the plurality of substantially identical user-configurable logic blocks.

43. A user-programmable device comprising a monolithic substrate having provided thereon:

(a) a plurality of first through Nth input/output means for receiving output signals to be output from the substrate and for coupling the output signals to points outside the substrate, or for receiving input signals from points outside the substrate;

(b) a plurality of first through Kth configurable logic means each for carrying out a programmably-redefinable logic function;

(c) an interconnect structure for providing interconnections between said plurality of configurable logic means and said plurality of input/output means, the interconnect structure including:

(c.1) partially-populated crossbar means for selectively providing programmably-redefinable and bidirectional couplings between subsets of the N input/output means and respective subsets of the K configurable logic means, wherein each combination of a subset of input/output means and a respectively cross-couplable subset of configurable logic means contains at least two of said plurality of N input/output means or at least two of said plurality of K configurable logic means, and wherein signal propagation delay between each input/output means and each respectively cross-couplable configurable logic means is substantially the same irrespective of which of the N input/output means is selectively coupled to which of the K configurable logic means.

44. A user-programmable device according to claim 43 wherein each said combination of a predefined subset of input/output means and a respectively cross-couplable subset of configurable logic means contains:

a same first number of input/output means, and a same second number of configurable logic means.

45. A user-programmable device according to claim 44 wherein:

K is greater than 4; and each said combination of a predefined subset of input/output means and a respectively cross-couplable subset of configurable logic means contains at least four of said plurality of K configurable logic means.

46. A user-programmable device according to claim 43 wherein:

N is at least 4;

K is at least 4; and each said combination of a predefined subset of input/output means and a respectively cross-couplable subset of configurable logic means contains at least two of said plurality of N input/output means or at least two of said plurality of K configurable logic means.

47. A user-programmable device according to claim 43 wherein:

N is at least 8;

K is at least 8; and each said combination of a predefined subset of input/output means and a respectively cross-couplable subset of configurable logic means contains at least four of said plurality of N input/output means or at least two of said plurality of K configurable logic means.

48. A user-programmable device according to claim 43 wherein said partially-populated crossbar means includes:

(c.1a) a first plurality of M lines crossing with a second plurality of N lines to thereby define a plurality of M·N crossing points;

(c.1b) a plurality of less than M·N programmable interconnect elements partially-populating said M·N crossing points in symmetrical fashion, each programmable interconnect element providing a programmably-redefinable interconnection between the crossing lines of the respectively populated crossing point, said symmetrical partially-populating of the M·N crossing points being such that each line among said first plurality of M lines has essentially a same first number of programmable interconnect elements coupled thereto and such that each line among said second plurality of N lines has essentially a same second number of programmable interconnect elements coupled thereto.

49. A user-programmable device according to claim 43 wherein said programmable interconnect elements include electrically erasable and reprogrammable nonvolatile memory devices.

* * * * *